(12) United States Patent
Pang et al.

(10) Patent No.: US 12,543,458 B2
(45) Date of Patent: Feb. 3, 2026

(54) DISPLAY APPARATUS HAVING A LIGHT-EMITTING DEVICE AND HEATING SIGNAL WIRING ON BEZEL AREA, AND METHOD OF FORMING THEREOF

(71) Applicant: LG Display Co., Ltd., Seoul (KR)

(72) Inventors: Hee Suk Pang, Paju-si (KR); Joo Hwan Shin, Paju-si (KR); Suk Yang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 558 days.

(21) Appl. No.: 18/072,133

(22) Filed: Nov. 30, 2022

(65) Prior Publication Data

US 2023/0217752 A1    Jul. 6, 2023

(30) Foreign Application Priority Data

Dec. 31, 2021   (KR) .......................... 10-2021-0194732

(51) Int. Cl.
*H10K 59/131*     (2023.01)
*H10K 59/80*      (2023.01)
*H10K 71/00*      (2023.01)
*H10K 59/12*      (2023.01)

(52) U.S. Cl.
CPC ......... *H10K 59/131* (2023.02); *H10K 59/873* (2023.02); *H10K 59/8794* (2023.02); *H10K 71/00* (2023.02); *H10K 59/1201* (2023.02)

(58) Field of Classification Search
CPC ............... H10K 59/131; H10K 59/873; H10K 59/8794; H10K 59/1201; H10K 71/00
See application file for complete search history.

(56) References Cited

U.S. PATENT DOCUMENTS

| 9,312,319 B2 | 4/2016 | Lee et al. |
| 9,525,015 B2 | 12/2016 | Lee et al. |
| 11,489,023 B2* | 11/2022 | Son ...................... H10K 71/221 |
| 11,793,058 B1* | 10/2023 | Son ........................ H10K 71/00 |
| | | 257/40 |
| 2014/0159002 A1 | 6/2014 | Lee et al. |
| 2016/0254335 A1 | 9/2016 | Lee et al. |
| 2021/0050391 A1* | 2/2021 | Son .................... H10K 59/8731 |

FOREIGN PATENT DOCUMENTS

| CN | 112346269 A | * | 2/2021 | ....... G02F 1/133382 |
| KR | 10-2011-0016767 A | | 2/2011 | |
| KR | 10-1994227 B1 | | 9/2019 | |

OTHER PUBLICATIONS

English translation of CN-112346269 (Year: 2021).*

* cited by examiner

*Primary Examiner* — Lex H Malsawma
(74) *Attorney, Agent, or Firm* — Fenwick & West LLP

(57) ABSTRACT

A display apparatus including a light-emitting device is disclosed. The light-emitting device is on a display area of a device substrate. An overcoat layer is disposed between the device substrate and the light-emitting device. The overcoat layer extends on a bezel area of the device substrate. A heating signal wiring is between the bezel area of the device substrate and the overcoat layer. A heating pattern electrically connected to the heating signal wiring is on the over-coat layer of the bezel area. A surface of the heating pattern opposite to the device substrate may be in contact with an adhesive layer covering the light-emitting device. Thus, in the display apparatus, the damage of the light-emitting device due to external moisture may be prevented or at least reduced.

20 Claims, 17 Drawing Sheets

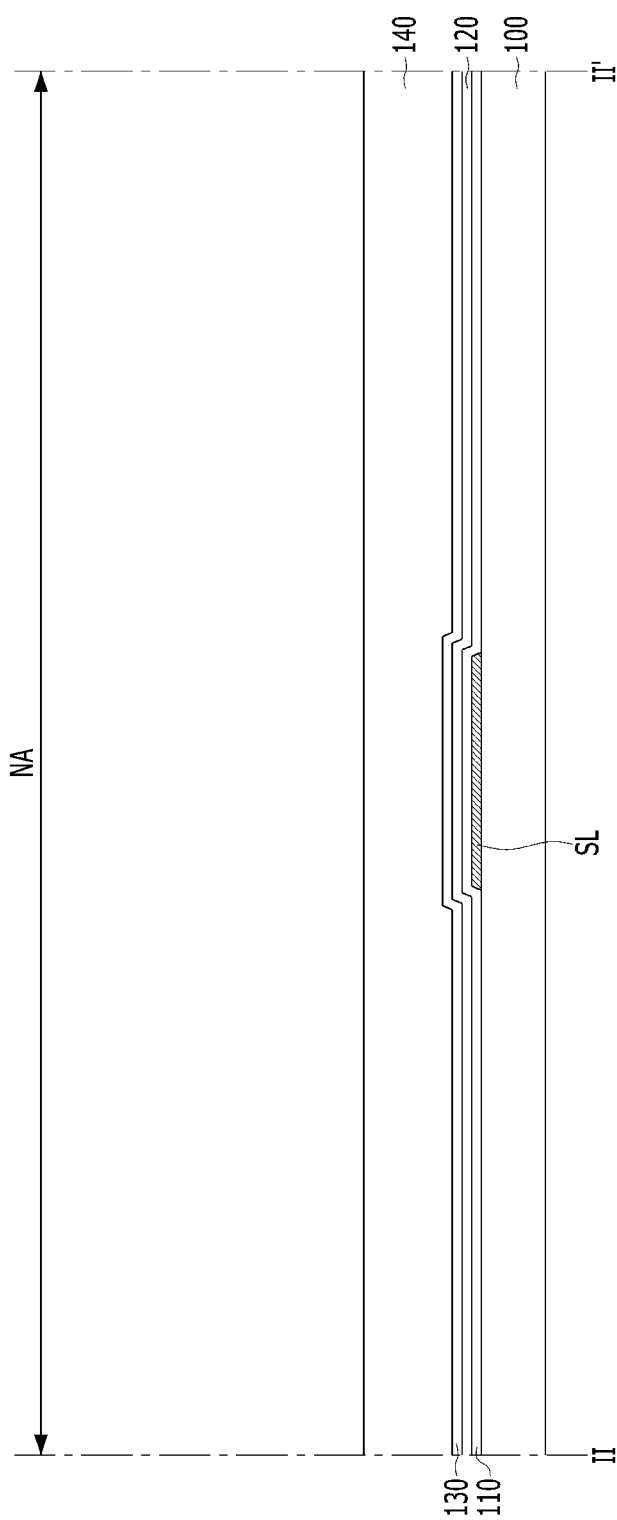

DISPLAY APPARATUS HAVING A LIGHT-EMITTING DEVICE AND HEATING SIGNAL WIRING ON BEZEL AREA, AND METHOD OF FORMING THEREOF

CROSS-REFERENCE TO RELATED APPLICATION

This application claims the benefit of Republic of Korea Patent Application No. 10-2021-0194732, filed on Dec. 31, 2021, which is hereby incorporated by reference in its entirety.

BACKGROUND

Field of Technology

The present disclosure relates to a display apparatus in which a light-emitting device is disposed on a display area of a device substrate.

Discussion of the Related Art

Generally, a display apparatus displays an image to a user. For example, the display apparatus may include pixel areas. Each of the pixel areas may display a specific color. For example, each of the pixel areas includes a light-emitting device. The light-emitting device may emit light of a specific color. For example, the light-emitting device may include a first electrode, a light-emitting layer and a second electrode, which are sequentially stacked.

A pixel driving circuit electrically connected to the light-emitting device may be disposed in each pixel area. The pixel driving circuit may supply a driving current corresponding to a data signal to the light-emitting device according to a gate signal. For example, the pixel driving circuit may include at least one thin film transistor. A plurality of pixel driving circuits for independently controlling each pixel area may be stacked on the device substrate.

The light-emitting layer may be vulnerable to moisture. For example, in the display apparatus, the second electrode may cover an end portion of the light-emitting layer. The light-emitting layer may be formed by a deposition process. For example, the light-emitting layer may include a tail portion in which a thickness is gradually reduced. However, in the display apparatus, a size occupied by the second electrode may be increased by the tail portion of the light-emitting layer. Thus, in the display apparatus, a non-emission area may be increased. That is, in the display apparatus, an emission area may be relatively decreased, and the quality of the image may be reduced.

SUMMARY

Accordingly, the present disclosure is directed to a display apparatus that substantially obviates one or more problems due to limitations and disadvantages of the related art.

An object of the present disclosure is to provide a display apparatus capable of preventing or at least reducing the damage of the light-emitting device due to external moisture, without increasing a bezel area.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus comprising: a device substrate including a display area and a bezel area that at least partially surrounds the display area; an overcoat layer on the display area and the bezel area of the device substrate; a light-emitting device on a portion of the overcoat layer that is on the display area, the light-emitting device configured to emit light; a heating signal wiring between the device substrate and the portion of the overcoat layer on the bezel area; a plurality of heating patterns on the portion of the overcoat layer that is on the bezel area, the plurality of heating patterns electrically connected to the heating signal wiring; an adhesive layer on the light-emitting device in the display area and on the plurality of heating patterns in the bezel area, the adhesive layer in contact with the plurality of heating patterns; and an encapsulation substrate on the adhesive layer, the encapsulation substrate on the display area and the bezel area of the device substrate.

In one embodiment, a display apparatus comprises: a substrate including a display area and a bezel area that at least partially surrounds the display area; a light-emitting device in the display area, the light emitting device including a first electrode in the display area, a light-emitting layer including a first portion on the first electrode in the display area and a second portion that extends from the first portion of the light-emitting layer to the bezel area, and a second electrode including a first portion on the first portion of the light-emitting layer in the display area and a second portion that extends from the first portion of the second electrode to the bezel area; a heating signal wiring on the bezel area of the substrate and partially surrounds the display area, the heating signal wiring configured to apply a current, wherein the second portion of the light-emitting layer in the bezel area and the second portion of the second electrode in the bezel area are non-overlapping with the heating signal wiring.

In one embodiment, a method of forming a display apparatus comprises: forming a substrate including a display area and a bezel area that at least partially surrounds the display area; forming a heating signal wiring on the bezel area of the substrate that partially surrounds the display area; forming an overcoat layer including a portion that is on the display area and a portion that is on the heating signal wiring in the bezel area; forming a first electrode on the portion of the overcoat layer in the display area and a plurality of heating patterns on the portion of the overcoat layer in the bezel area, the plurality of heating patterns electrically connected to the heating signal wiring; forming a light-emitting layer including a first portion that is on the first electrode in the display area and a second portion that extends from the first portion of the light-emitting layer to the bezel area such that a part of the second portion of the light-emitting layer is on the plurality of heating patterns; forming a second electrode including a first portion that is on the first portion of the light-emitting layer in the display area and a second portion that extends from the first portion of the second electrode to the bezel area such that a part of the second portion of the second electrode is on the part of the second portion of the light-emitting layer that is on the plurality of heating patterns; and removing the part of the second portion of the light emitting layer and the part of the second portion of the second electrode by applying a current to the heating signal wiring that supplies the current to the plurality of heating patterns.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings:

FIGS. 5A, 5B, 6A, 6B, 7A, 7B, 8A, 8B, 9A, and 9B are views sequentially showing a method of forming the display apparatus according to the embodiment of the present disclosure.

DETAILED DESCRIPTION

Figure 1:
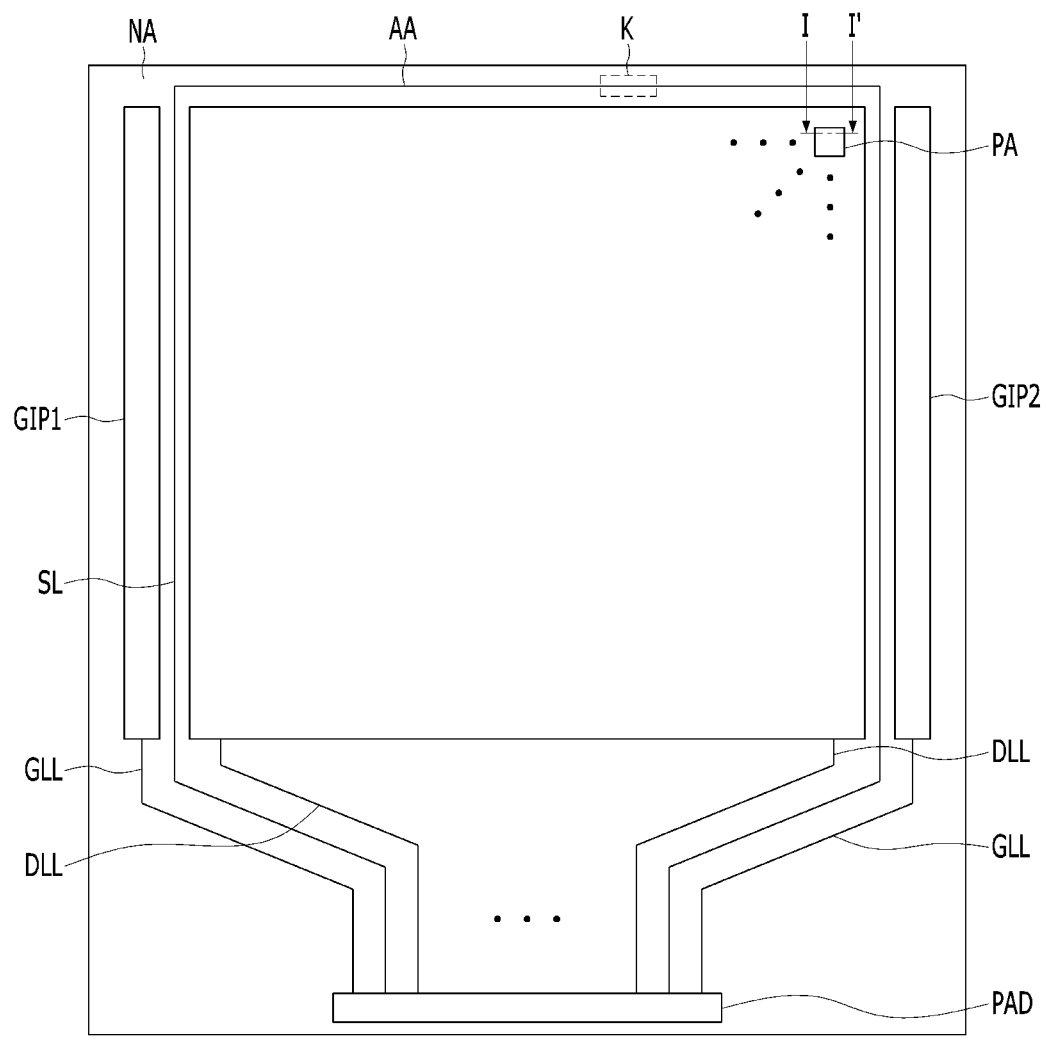
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
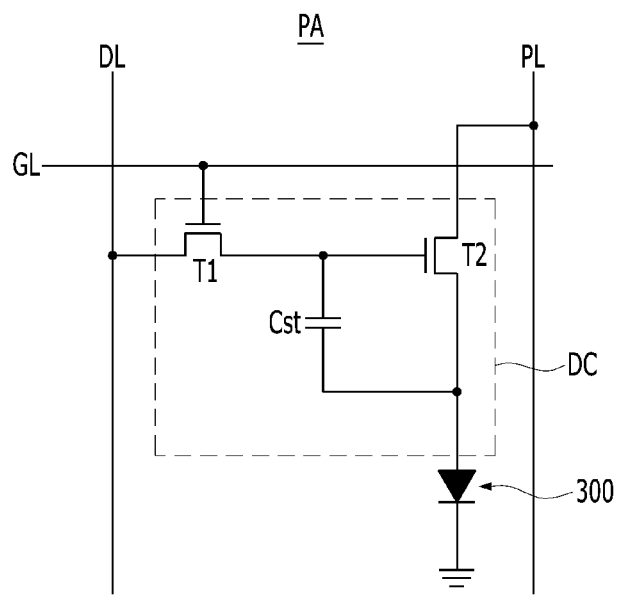
FIG. 2 is a view showing a circuit of a unit pixel area in the display apparatus according to the embodiment of the present disclosure.
Figure 3:
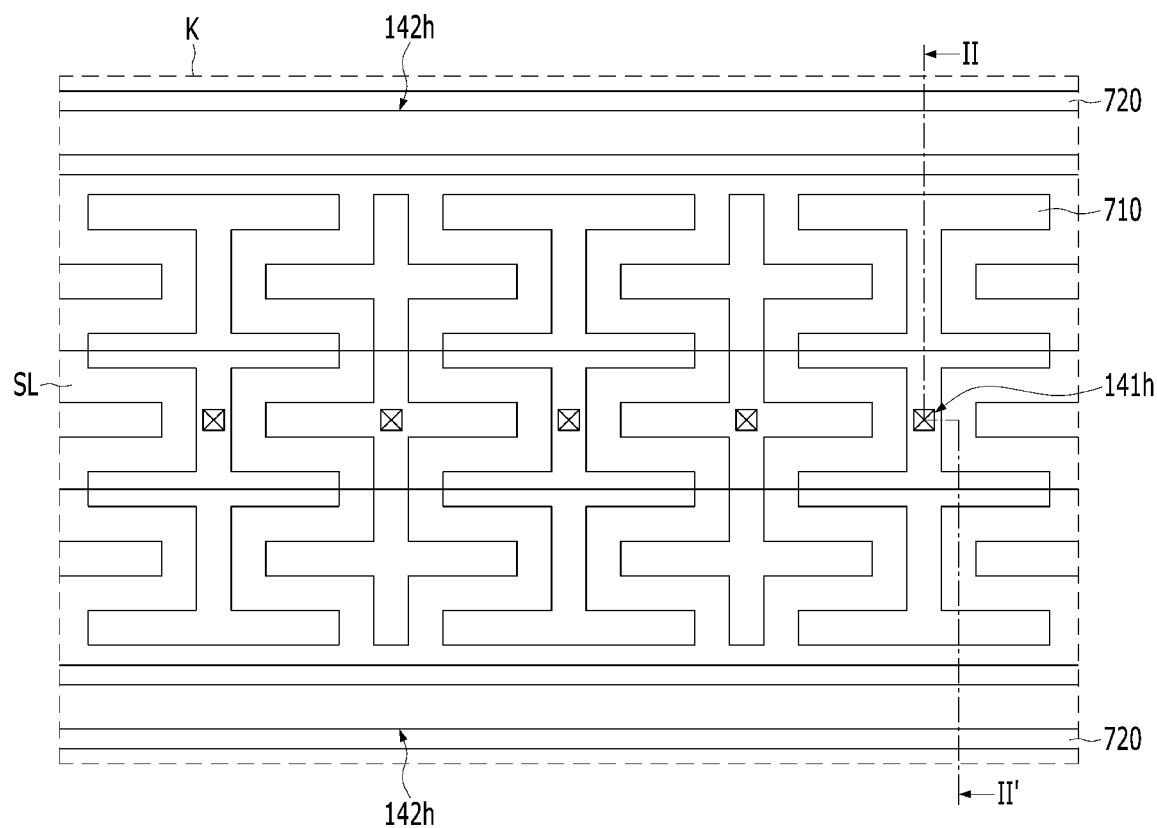
FIG. 3 is an enlarged view of K region in FIG. 1 according to an embodiment of the present disclosure.
Figure 4A:
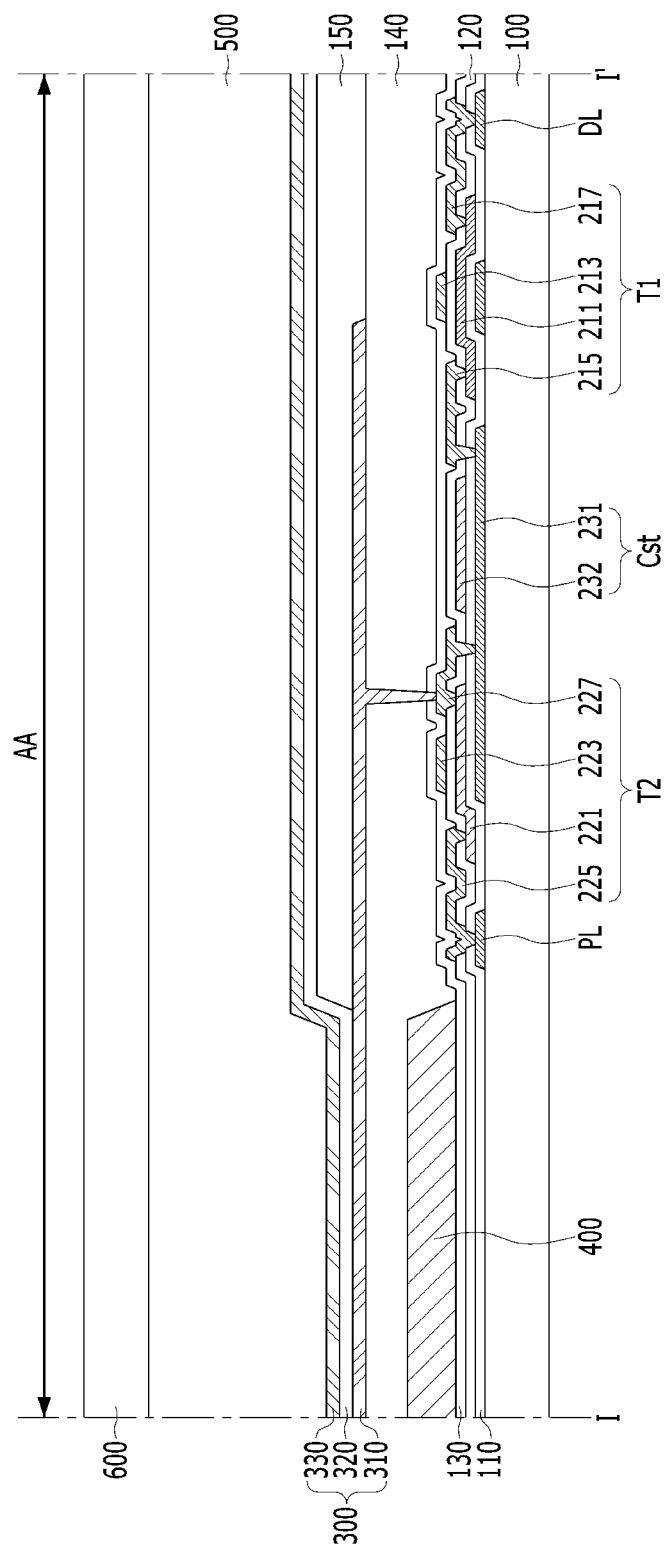
FIG. 4A is a cross-section view taken along I-I' of FIG. 1 according to an embodiment of the present disclosure.
Figure 4B:
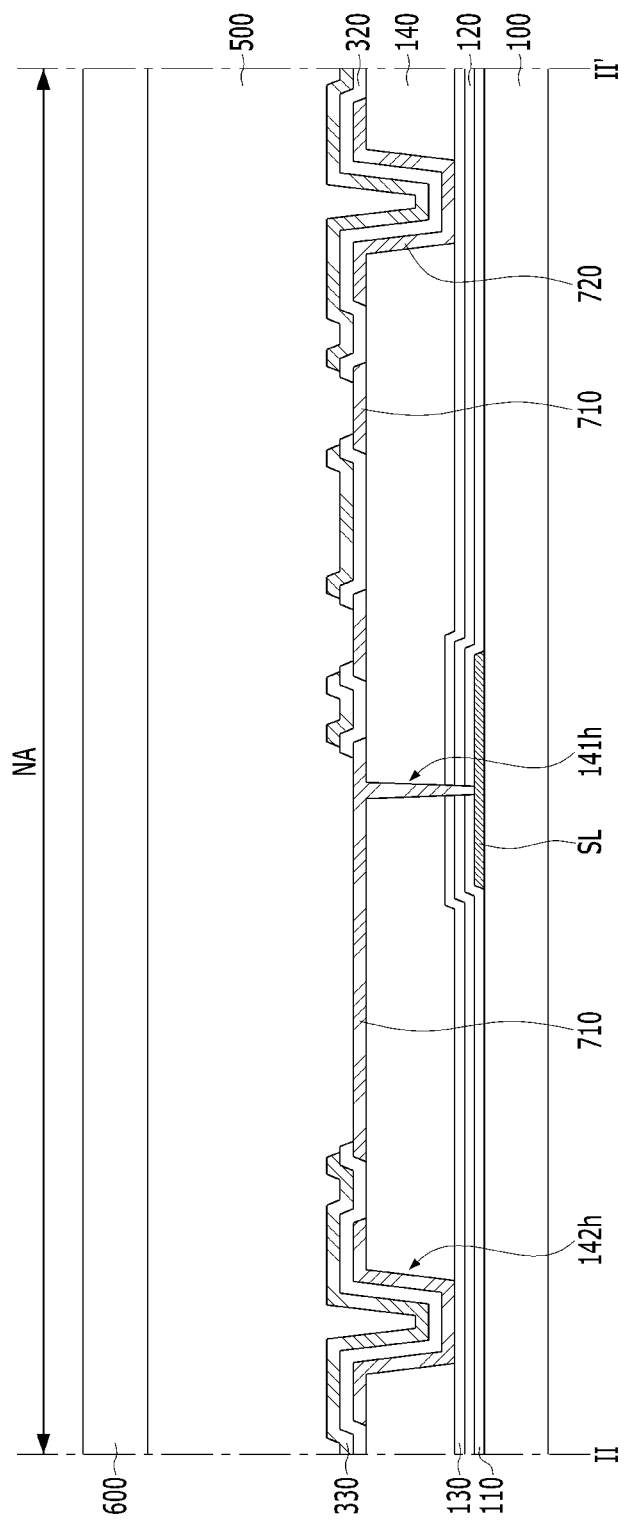
FIG. 4B is a cross-section view taken along II-II' of FIG. 3 according to an embodiment of the present disclosure.

FIG. 1 is a view schematically showing a display apparatus according to an embodiment of the present disclosure. FIG. 2 is a view showing a circuit of a unit pixel area in the display apparatus according to the embodiment of the present disclosure. FIG. 3 is an enlarged view of K region in FIG. 1 according to an embodiment of the present disclosure. FIG. 4A is a cross section view taken along I-I' of FIG. 1 according to an embodiment of the present disclosure. FIG. 4B is a cross section view taken along II-IP of FIG. 3 according to an embodiment of the present disclosure.

Referring to FIGS. 1 to 3, 4A and 4B, the display apparatus according to the embodiment of the present disclosure may include a device substrate 100. The device substrate 100 may include an insulating material. The device substrate 100 may include a transparent material. For example, the device substrate 100 may include glass or plastic.

The device substrate 100 may include a display area AA and a bezel area NA. A plurality of pixel areas PA may be disposed in the display area AA of the device substrate 100. The bezel area NA may provide various signals for the operation of each pixel area PA. For example, at least one gate driver GIP1 and GIP2 and a pad portion PAD transmitting a data signal to each pixel area PA may be disposed on the bezel area NA of the device substrate 100. The pad portion PAD may be electrically connected to the gate driving GIP1 and GIP2. For example, data link lines DLL connecting the pad portion PAD and the display area AA and gate link lines GLL connecting the pad portion PAD and the gate driver GIP1 and GIP2 may be disposed on the bezel area NA of the device substrate 100.

Each of the pixel areas PA may display a specific color. For example, a light-emitting device 300 may be disposed in each pixel area PA. The light-emitting device 300 may emit light displaying a specific color. For example, the light-emitting device 300 may include a first electrode 310, a light-emitting layer 320 and a second electrode 330, which are sequentially stacked.

The first electrode 310 may include a conductive material. The first electrode 310 may have a high transmittance. For example, the first electrode 310 may be a transparent electrode made of a transparent conductive material, such as ITO and IZO.

The light-emitting layer 320 may generate light having luminance corresponding to a voltage difference between the first electrode 310 and the second electrode 330. For example, the light-emitting layer 320 may include an emission material layer (EML) having an emission material. The emission material may include an organic material, an inorganic material or a hybrid material. For example, the display apparatus according to the embodiment of the present disclosure may be an organic light-emitting display apparatus including an organic emission material.

The light-emitting layer 320 may have a multi-layer structure. For example, the light-emitting layer 320 may further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 320 may be improved.

The second electrode 330 may include a conductive material. The second electrode 330 may include a material different from the first electrode 310. The reflectance of the second electrode 330 may be greater than the reflectance of the first electrode 310. For example, the second electrode 330 may include a metal, such as aluminum (Al) and silver (Ag). Thus, in the display apparatus according to the embodiment of the present disclosure, the light generated by the light-emitting layer 320 may be emitted outside through the first electrode 310 and the device substrate 100.

A pixel driving circuit DC electrically connected to the light-emitting device 300 may be disposed in each pixel area PA. The operation of the light-emitting device 300 in each pixel area PA may be controlled by the pixel driving circuit DC of the corresponding pixel area PA. The pixel driving circuit DC of each pixel area PA may be electrically connected to one of data lines DL, one of gate lines GL, and one of power voltage supply lines PL. The data lines DL may be electrically connected to the data link lines DLL. The gate lines GL may be electrically connected to the gate driver GIP1 and GIP2. The power voltage supply lines PL may be electrically connected to a power unit. For example, the pixel driving circuit DC of each pixel area PA may supply a driving current corresponding to the data signal to the light-emitting device 300 of the corresponding pixel area PA according to the gate signal. The driving current generated by the pixel driving circuit DC of each pixel area PA may apply to the light-emitting device 300 of the corresponding pixel area PA for one frame. For example, the pixel driving circuit DC of each pixel area PA may include a first thin film transistor T1, a second thin film transistor T2 and a storage capacitor Cst.

The first thin film transistor T1 may include a first semiconductor pattern 211, a first gate electrode 213, a first source electrode 215 and a first drain electrode 217. The second thin film transistor T2 may have the same structure as the first thin film transistor T1. For example, the second thin film transistor T2 may include a second semiconductor pattern 221, a second gate electrode 223, a second source electrode 225 and a second drain electrode 227.

The first semiconductor pattern 211 and the second semiconductor pattern 221 may include a semiconductor material. For example, the first semiconductor pattern 211 and the second semiconductor pattern 221 may include an oxide semiconductor, such as IGZO. The second semiconductor pattern 221 may include the same material as the first semiconductor pattern 211. For example, the second semiconductor pattern 221 may be disposed on the same layer as the first semiconductor pattern 211. The second semiconductor pattern 221 may be formed simultaneously with the first semiconductor pattern 211.

Each of the first semiconductor pattern 211 and the second semiconductor pattern 221 may include a source region, a drain region and a channel region. The channel region may be disposed between the source region and the drain region. The source region and the drain region may have a resistance lower than the channel region. For example, the source region and the drain region may include a conductorized region of an oxide semiconductor. The channel region may be a region of an oxide semiconductor, which may be not a conductorized.

The first gate electrode 213 and the second gate electrode 223 may include a conductive material. For example, the first gate electrode 213 and the second gate electrode 223 may include a metal, such as aluminum (Al), chrome (Cr), copper (Cu), molybdenum (Mo), titanium (Ti) and tungsten (W). The second gate electrode 223 may include the same material as the first gate electrode 213. For example, the second gate electrode 223 may be disposed on the same layer as the first gate electrode 213. The second gate electrode 223 may be formed simultaneously with the first gate electrode 213.

The first gate electrode 213 may be disposed on the first semiconductor pattern 211. For example, the first gate electrode 213 may overlap the channel region of the first semiconductor pattern 211. The first gate electrode 213 may be insulated from the first semiconductor pattern 211. For example, the channel region of the first semiconductor pattern 211 may have an electric conductivity corresponding to a voltage applied to the first gate electrode 213. The second gate electrode 223 may be disposed on the second semiconductor pattern 221. For example, the second gate electrode 223 may overlap the channel region of the second semiconductor pattern 221. The second gate electrode 223 may be insulated from the second semiconductor pattern 221. The channel region of the second semiconductor pattern 221 may have an electric conductivity corresponding to a voltage applied to the second gate electrode 223.

The first source electrode 215, the first drain electrode 217, the second source electrode 225 and the second drain electrode 227 may include a conductive material. For example, the first source electrode 215, the first drain electrode 217, the second source electrode 225 and the second drain electrode 227 may include a metal, such as aluminum (Al), chrome (Cr), copper (Cu), molybdenum (Mo), titanium (Ti) and tungsten (W). The first drain electrode 217 may include the same material as the first source electrode 215. For example, the first drain electrode 217 may be disposed on the same layer as the first source electrode 215. The first drain electrode 217 may be formed simultaneously with the first source electrode 215. The second drain electrode 227 may include the same material as the second source electrode 225. For example, the second drain electrode 227 may be disposed on the same layer as the second source electrode 225. The second drain electrode 227 may be formed simultaneously with the second source electrode 225.

The first source electrode 215 and the first drain electrode 217 may include the same material as the first gate electrode 213. For example, the first source electrode 215 and the first drain electrode 217 may be disposed on the same layer as the first gate electrode 213. The first source electrode 215 and the first drain electrode 217 may be formed simultaneously with the first gate electrode 213. The first source electrode 215 and the first drain electrode 217 may be insulated from the first gate electrode 213. For example, the first source electrode 215 and the first drain electrode 217 may be spaced away from the first gate electrode 213.

The second source electrode 225 and the second drain electrode 227 may include the same material as the second gate electrode 223. For example, the second source electrode 225 and the second drain electrode 227 may be disposed on the same layer as the second gate electrode 223. The second source electrode 225 and the second drain electrode 227 may be formed simultaneously with the second gate electrode 223. The second source electrode 225 and the second drain electrode 227 may be insulated from the second gate electrode 223. For example, the second source electrode 225 and the second drain electrode 227 may be spaced away from the second gate electrode 223.

The first source electrode 215 may be electrically connected to the source region of the first semiconductor pattern 211. The first drain electrode 217 may be electrically connected to the drain region of the first semiconductor pattern 211. The second source electrode 225 may be electrically connected to the source region of the second semiconductor pattern 221. The second drain electrode 227 may be electrically connected to the drain region of the second semiconductor pattern 221. The second source electrode 225 and the second drain electrode 227 may include the same material as the first source electrode 215 and the first drain electrode 217. For example, the second source electrode 225 and the second drain electrode 227 may be disposed on the same layer as the first source electrode 215 and the first drain electrode 217. The second source electrode 225 and the second drain electrode 227 may be formed simultaneously with the first source electrode 215 and the first drain electrode 217. The first source electrode 215, the first drain electrode 217, the second source electrode 225 and the second drain electrode 227 may be spaced away from each other.

The thin film transistors T1 and T2 of each pixel area PA may be disposed between the device substrate 100 and the light-emitting device 300 of the corresponding pixel area PA. At least one of insulating layers 110, 120, 130, 140 and 150 may be disposed on the device substrate 100. Thus, in the display apparatus according to the embodiment of the present disclosure, unnecessary connection between the thin film transistors T1 and T2 and the light-emitting device 300 of each pixel area PA may be prevented. For example, a device buffer layer 110, a gate insulating layer 120, a lower passivation layer 130, an over-coat layer 140 and a bank insulating layer 150 may be sequentially stacked on the device substrate 100.

The device buffer layer 110 may include an insulating material. For example, the device buffer layer 110 may include an inorganic insulating material, such as silicon oxide (SiO) and silicon nitride (SiN). The device buffer layer 110 may have a multi-layer structure. For example, the device buffer layer 110 may have a stacked structure of a layer made of silicon nitride (SiN) and a layer made of silicon oxide (SiO).

The device buffer layer 110 may be disposed between the device substrate 100 and the thin film transistors T1 and T2 of each pixel area PA. The device buffer layer 110 may prevent or at least reduce pollution due to the device substrate 100 in a process of forming the thin film transistors T1 and T2. For example, an entire surface of the device substrate 100 toward the thin film transistors T1 and T2 of each pixel area PA may be covered by the device buffer layer 110. The thin film transistors T1 and T2 of each pixel area PA may be disposed on the device buffer layer 110.

The gate insulating layer 120 may include an insulating material. For example, the gate insulating layer 120 may include an inorganic insulating material, such as silicon oxide (SiO) and silicon nitride (SiN). The gate insulating layer 120 may include a material having a high dielectric constant. For example, the gate insulating layer 120 may include a High-K material, such as hafnium oxide (HfO). The gate insulating layer 120 may have a multi-layer structure.

The gate insulating layer 120 may be disposed on the device buffer layer 110. The gate insulating layer 120 may extend between the semiconductor pattern 211 and 221 and the gate electrode 213 and 223 of each thin film transistor T1 and T2. For example, the gate electrode 213 and 223 of each thin film transistor T1 and T2 may be insulated from the semiconductor pattern 211 and 221 of the corresponding thin film transistor T1 and T2 by the gate insulating layer 120. The gate insulating layer 120 may cover the first semiconductor pattern 211 and the second semiconductor pattern 221 of each pixel area PA. The first gate electrode 213 and the second gate electrode 223 of each pixel area PA may be disposed on the gate insulating layer 120.

The first source electrode 215, the first drain electrode 217, the second source electrode 225 and the second drain electrode 227 of each pixel area PA may be disposed on the gate insulating layer 120. For example, the gate insulating layer 120 of each pixel area PA may include a first source contact hole exposing the source region of the first semiconductor pattern 211, a first drain contact hole exposing the drain region of the first semiconductor pattern 211, a second source contact hole exposing the source region of the second semiconductor pattern 221, and a second drain contact hole exposing the drain region of the second semiconductor pattern 221.

The lower passivation layer 130 may include an insulating material. For example, the lower passivation layer 130 may include an inorganic insulating material, such as silicon oxide (SiO) and silicon nitride (SiN).

The lower passivation layer 130 may be disposed on the gate insulating layer 120. The lower passivation layer 130 may prevent or at least reduce the damage of each thin film transistor T1 and T2 due to external moisture and impact. For example, the first gate electrode 213, the first source electrode 215, the first drain electrode 217, the second gate electrode 223, the second source electrode 225 and the second drain electrode 227 of each pixel area PA may be covered by the lower passivation layer 130. The lower passivation layer 130 may extend along a surface of each thin film transistor T1 and T2 opposite to the device substrate 100. The lower passivation layer 130 may be in contact with the gate insulating layer 120 at an area that is non-overlapping with the thin film transistors T1 and T2 in each pixel area PA.

The over-coat layer 140 may include an insulating material. The over-coat layer 140 may include a material different from the lower passivation layer 130. For example, the over-coat layer 140 may include an organic insulating material.

The overcoat layer 140 may be disposed on the lower passivation layer 130. The overcoat layer 140 may remove a thickness difference due to the thin film transistors T1 and T2 of each pixel area PA. For example, an upper surface of the over-coat layer 140 opposite to the device substrate 100 may be a flat surface. The first electrode 310, the light-emitting layer 320 and the second electrode 330 of each pixel area PA may be sequentially stacked on the upper surface of the over-coat layer 140. For example, the first electrode 310 of each pixel area PA may be electrically connected to the second thin film transistor T2 of the corresponding pixel area PA through one of electrode contact holes penetrating the overcoat layer 140. Thus, in the display apparatus according to the embodiment of the present disclosure, the characteristics deviation due to the generating position difference of the light emitted outside through the device substrate 100 may be prevented or at least reduced.

The bank insulating layer 150 may include an insulating material. For example, the bank insulating layer 150 may include an organic insulating material. The bank insulating layer 150 may include a material different from the over-coat layer 140.

The bank insulating layer 150 may be disposed on the overcoat layer 140. The first electrode 310 of each light-emitting device 300 may be insulated from the first electrode 310 of adjacent light-emitting device 300 by the bank insulating layer 150. For example, the bank insulating layer 150 may cover an edge of the first electrode 310 in each pixel area PA. Thus, in the display apparatus according to the embodiment of the present disclosure, the light-emitting device 300 of each pixel area PA may be independently defined by the bank insulating layer 150. The light-emitting layer 320 and the second electrode 330 of each light-emitting device 300 may be stacked on a portion of the corresponding first electrode 310 exposed by the bank insulating layer 150. For example, the bank insulating layer 150 may define emission area in each pixel area PA.

The emission area of each pixel area PA defined by the bank insulating layer 150 may not overlap (e.g., non-overlapping) the pixel driving circuit DC of the corresponding pixel area PA. For example, the thin film transistors T1 and T2 of each pixel area PA may be disposed outside the emission area of the corresponding pixel area PA. Thus, in the display apparatus according to the embodiment of the present disclosure, the light emitted from the light-emitting device 300 of each pixel area PA may be not blocked by the thin film transistors T1 and T2 of the corresponding pixel area PA.

The light-emitting layer 320 of each light-emitting device 300 may be connected to the light-emitting layer 320 of adjacent light-emitting device 300. For example, the light-emitting layer 320 of each light-emitting device 300 of each pixel area PA may extend onto the bank insulating layer 150 into another pixel area PA. The light emitted from the light-emitting device 300 of each pixel area PA may display the same color as the light emitted from the light-emitting device 300 of adjacent pixel area PA. For example, the light-emitting layer 320 of each pixel area PA may generate white light.

However, each of the pixel areas PA may display a color different from adjacent pixel area PA. For example, each of the pixel area PA may include a color filter 400 overlapping with the emission area of the corresponding pixel area PA. The color filter 400 may realize a specific color using light passing therethrough. For example, the color filter 400 of each pixel area PA may be disposed on a path of the light emitted from the light-emitting device 300 in the corresponding pixel area PA. The color filter 400 of each pixel area PA may be disposed between the device substrate 100 and the light-emitting device 300 of the corresponding pixel area PA. For example, the color filter 400 of each pixel area PA may be disposed between the device passivation layer 130 and the overcoat layer 140. A thickness difference due to the color filter 400 of each pixel area PA may be removed by the over-coat layer 140.

A voltage applied to the second electrode 330 of each light-emitting device 300 may be the same as a voltage applied to the second electrode 330 of an adjacent light-emitting device 300. For example, the second electrode 330 of each light-emitting device 300 may be electrically connected to the second electrode 330 of adjacent light-emitting device 300. The second electrode 330 of each light-emitting device 300 may include the same material as the second electrode 330 of adjacent light-emitting device 300. For example, the second electrode 330 of each light-emitting device 300 may be formed simultaneously with the second electrode 330 of adjacent light-emitting device 300. Thus, in the display apparatus according to the embodiment of the present disclosure, a process of forming the second electrode 330 of each light-emitting device 300 may be simplified.

A light-blocking pattern 231 may be disposed between the device substrate 100 and each thin film transistor T1 and T2 so as to overlap the thin film transistors T1 and T2. For example, the light-blocking pattern 231 may be disposed between the device substrate 100 and the device buffer layer 110. The light-blocking pattern 250 may include a material capable of absorbing or reflecting light. The light-blocking pattern 231 may include a conductive material. For example, the light-blocking pattern 231 may include a metal, such as aluminum (Al), chrome (Cr), copper (Cu), molybdenum (Mo), titanium (Ti) and tungsten (W).

External light travelling in a direction of the semiconductor pattern 211 and 221 of each thin film transistor T1 and T2 may be blocked by the light-blocking pattern 231. For example, the light-blocking pattern 231 may include a region overlapping with the channel region of each semiconductor pattern 211 and 221. Thus, in the display apparatus according to the embodiment of the present disclosure, a characteristics change of each thin film transistor T1 and T2 due to the external light may be prevented.

The first thin film transistor T1 of each pixel driving circuit DC may transmit the data signal to the second thin film transistor T2 of the corresponding pixel driving circuit DC according to the gate signal. For example, the first gate electrode 213 of each pixel driving circuit DC may be electrically connected to one of the gate lines GL, and the first source electrode 215 of each pixel driving circuit DC may be electrically connected to one of the data lines DL. The second thin film transistor T2 of each pixel driving circuit DC may generate the driving current corresponding to the data signal. For example, the second gate electrode 223 of each pixel driving circuit DC may be electrically connected to the first drain electrode 217 of the corresponding pixel driving circuit DC, and the second source electrode 225 of each pixel driving circuit DC may be electrically connected to one of the power voltage supply lines PL. The driving current generated by the second thin film transistor T2 of each pixel area PA may be provided to the light-emitting device 300 of the corresponding pixel area PA. For example, the first electrode 310 of each pixel area PA may be electrically connected to the second drain electrode 227 of the corresponding pixel area PA.

The gate lines GL may be disposed on the same layer as the gate electrode 213 and 223 of each thin film transistor T1 and T2. For example, the gate lines GL may be disposed between the gate insulating layer 120 and the lower passivation layer 130. The gate lines GL may include the same material as the gate electrode 213 and 223 of each thin film transistor T1 and T2. For example, the gate lines GL may be formed simultaneously with the gate electrode 213 and 223 of each thin film transistor T1 and T2. The first gate electrode 213 of each pixel area PA may be in direct contact with the corresponding gate line GL.

The data lines DL may intersect the gate lines GL. The data lines DL may be disposed on a layer different from the gate lines GL. For example, the data lines DL may be disposed between the device substrate 100 and the device buffer layer 110. The data lines DL may include the same material as the light-blocking pattern 231. For example, the data lines DL may be formed simultaneously with the light-blocking pattern 231. The device buffer layer 110 and the gate insulating layer 120 may include data contact holes exposing a portion of each data line DL. The first source electrode 215 of each pixel area PA may be connected to the corresponding data line DL through one of the data contact holes.

The power voltage supply lines PL may extend in parallel to the data lines DL. For example, the power voltage supply lines PL may intersect the gate lines GL. The power voltage supply lines PL may be disposed on the same layer as the data lines DL. For example, the power voltage supply lines PL may be disposed between the device substrate 100 and the device buffer layer 110. The power voltage supply lines PL may include the same material as the data lines DL. For example, the power voltage supply lines PL may be formed simultaneously with the data lines DL. The device buffer layer 110 and the gate insulating layer 120 may include power contact holes exposing a portion of each power voltage supply line PL. The second source electrode 225 of each pixel area PA may be connected to the corresponding power voltage supply line PL through one of the power contact holes.

The storage capacitor Cst of each pixel driving circuit DC may maintain a signal applied to the second gate electrode 223 of the corresponding pixel driving circuit DC for one frame. For example, the storage capacitor Cst of each pixel driving circuit DC may be electrically connected between the second gate electrode 223 and the second drain electrode 227 of the corresponding pixel driving circuit DC. The storage capacitor Cst of each pixel driving circuit DC may include a capacitor electrode 232 stacked on a portion of the light-blocking pattern 231. For example, the light-blocking pattern 231 of each pixel area PA may function as an electrode of the storage capacitor Cst in the corresponding pixel driving circuit DC. The capacitor electrode 232 of each pixel driving circuit DC may be insulated from the corresponding light-blocking pattern 231. The storage capacitor Cst of each pixel driving circuit DC may be formed using a conductive layer disposed between the device substrate 100 and the over-coat layer 140. For example, the capacitor electrode 232 of each pixel driving circuit DC may be disposed between the device buffer layer 110 and the gate insulating layer 120.

The light-blocking pattern 231 of each pixel driving circuit DC may be electrically connected to the second drain electrode 227 of the corresponding pixel driving circuit DC. For example, the device buffer layer 110 may include storage contact holes disposed between the light-blocking pattern 231 and the drain region of the second semiconductor pattern 221 in each pixel area PA. The drain region of the second semiconductor pattern 221 in each pixel area PA may be connected to the light-blocking pattern 231 in the corresponding pixel area PA through one of the storage contact holes.

The capacitor electrode 232 of each pixel driving circuit DC may include the same material as the semiconductor patterns 211 and 221 of the corresponding pixel driving circuit DC. For example, the capacitor electrode 232 of each pixel driving circuit DC may include an oxide semiconductor, such as IGZO. The capacitor electrode 232 of each pixel driving circuit DC may be formed simultaneously with the semiconductor patterns 211 and 221 of the corresponding pixel driving circuit DC. The capacitor electrode 232 of each pixel driving circuit DC may have a resistance lower than the channel region of each semiconductor pattern 211 and 221 disposed in the corresponding pixel driving circuit DC. For example, the capacitor electrode 232 of each pixel driving circuit DC may include a conductorized region of an oxide semiconductor.

The data lines DL, the gate lines GL and the power voltage supply lines PL electrically connected to the pixel driving circuit DC of each pixel area PA may extend onto the bezel area NA of the device substrate 100. At least one of insulating layers 110, 120, 130, 140 and 150 for insulating between the data lines DL, the gate lines GL and the power voltage supply lines PL may be disposed on the bezel area NA of the device substrate 100. For example, the device buffer layer 110, the gate insulating layer 120, the lower passivation layer 130, the overcoat layer 140 and the bank insulating layer 150 may extend to the bezel area NA of the device substrate 100 from the active area AA. The device buffer layer 110, the gate insulating layer 120, the lower passivation layer 130, the overcoat layer 140 and the bank insulating layer 150 may be sequentially stacked on the bezel area NA of the device substrate 100.

A heating signal wiring SL may be disposed on the bezel area NA of the device substrate 100. The heating signal wiring SL may include a conductive material. The heating signal wiring SL may include a material having a relatively low resistance. For example, the heating signal wiring SL may include the same material as the light-blocking pattern 231. The heating signal wiring SL may be disposed between the device substrate 100 and the device buffer layer 110. The heating signal wiring SL may extend along an edge of the display area AA. For example, the heating signal wiring SL may be between the gate driver GIP1 and a first side of the display area AA (e.g., a left side) and may be between the gate driver GIP2 and a second side of the display area AA (e.g., a right side) from a plan view of the display device as shown in FIG. 1. In one embodiment, a current is applied to the heating signal wiring SL during manufacturing of the display device to remove a portion of the light-emitting layer 320 and a portion of the second electrode 330 that extend from the display area AA to the bezel area NA. The magnitude of the current is high enough to remove the portions of the light-emitting layer 320 and the second electrode 330 that are in the bezel area NA.

Heating patterns 710 may be disposed on the overcoat layer 140 of the bezel area NA. The heating patterns 710 may be disposed on the heating signal wiring SL so as to at least partially overlap the heating signal wiring SL. For example, the heating patterns 710 may be disposed side by side along the heating signal wiring SL. Each of the heating patterns 710 may be electrically connected to the heating signal wiring SL. For example, the overcoat layer 140 of the bezel area NA may include heating contact holes 141h partially exposing the heating signal wiring SL. Each of the heating patterns 710 may be connected to the heating signal wiring SL through one of the heating contact holes 141h. Thus, the current applied to the heating signal wiring SL is also applied to the heating patterns 710 to remove the portions of the light-emitting layer 320 and the second electrode 330 that are on the heating patterns 710 in the bezel area NA during manufacturing. By removing the portions of the light-emitting layer 320 and the second electrode 330 that are in the bezel area NA, deterioration of the light emitting layer 320 that is in the display area DA due to external moisture can be prevented or at least reduced without decreasing the display area AA.

Each of the heating patterns 710 may include a region overlapping with the heating signal wiring SL. Each of the heating patterns 710 may extend outside of the heating signal wiring SL. Thus, each of the heating patterns 710 has a portion that overlaps the heating signal wiring SL and a portion that is non-overlapping with the heating signal wiring SL. For example, each of the heating patterns 710 may include a region extending parallel to the heating signal wiring SL. Each of the heating patterns 710 may include a shape different from adjacent heating pattern 710. For example, the heating patterns 710 may be formed so that shapes that alternate with each other are repeated. Thus, each heating pattern 710 either has a first shape or a second shape that is different from the first shape and the heating patterns 710 with the first shape and the second shape are alternately disposed.

The heating patterns 710 may include a conductive material. The heating patterns 710 may be formed using a process of forming the light-emitting devices 300. For example, the heating patterns 710 may include the same material as the first electrode 310 of each light-emitting device 300.

At least one moisture-blocking trench 142h may be formed in the overcoat layer 140 of the bezel area NA. For example, the heating signal wiring SL may be disposed between a pair of moisture-blocking trenches 142h. Each of the moisture-blocking trenches 142h may completely penetrate through the entire thickness of the over-coat layer 140. For example, each of the moisture-blocking trenches 142h may partially expose the lower passivation layer 130. The moisture-blocking trenches 142h may extend along an edge of the display area AA. For example, each of the moisture-blocking trenches 142h may extend parallel to the heating signal wiring SL.

A barrier pattern 720 may be disposed inside each moisture-blocking trench 142h. For example, a surface of each moisture-blocking trench 142h may be covered by the barrier pattern 720. An end of the barrier pattern 720 may extend out of the moisture-blocking trench 142h onto the overcoat layer 140 of the bezel area NA towards the heating signal wiring SL. Furthermore, a part of the light-emitting layer 320 and a part of the second electrode 330 that are in the moisture-blocking trench 142 extend out of the moisture blocking trench 142h onto the overcoat layer 140 of the bezel area NA towards the heating signal wiring SL.

The barrier pattern 720 may include a material that blocks moisture. The barrier pattern 720 may be formed using a process of forming the light-emitting devices 300. For example, the barrier pattern 720 may include the same material as the first electrode 310 of each light-emitting device 300. The barrier pattern 720 may include the same material as the heating patterns 710. For example, the barrier pattern 720 may be formed simultaneously with the heating patterns 710. The light-emitting layer 320 and the second electrode 330 of each light-emitting device 300 may be sequentially stacked on the barrier pattern 720. Thus, in the display apparatus according to the embodiment of the present disclosure, the penetration of the external moisture through the overcoat layer 140 may be prevented.

An encapsulation substrate 600 may be attached on the second electrode 330 of each light-emitting device 300 by an entire surface adhesive layer 500. For example, the entire surface adhesive layer 500 may include an adhesive material. In one embodiment, the entire surface adhesive layer 500 extends from the display area AA to the bezel area BA. The encapsulation substrate 600 may prevent the damage of the light-emitting devices 300 due to the external moisture and impact. For example, the encapsulation substrate 600 may include a material having a specific hardness or more. The encapsulation substrate 600 may include a material having relatively high thermal conductivity. For example, the encapsulation substrate 600 may include a metal, such as aluminum (Al), nickel (Ni) and iron (Fe). Thus, in the display apparatus according to the embodiment of the present disclosure, the heat generated by the pixel driving circuit DC and the light-emitting device 300 of each pixel area PA may be dissipated through the encapsulation substrate 600. Therefore, in the display apparatus according to the embodiment of the present disclosure, the deterioration of the light-emitting layer 320 in each pixel area PA may be effectively prevented.

The entire surface adhesive layer 500 and the encapsulation substrate 600 may extend on the bezel area NA of the device substrate 100. For example, a surface of each heating pattern 710 opposite to the device substrate 100 may be in direct contact with the entire surface adhesive layer 600.

FIGS. 5A, 5B, 6A, 6B, 7A, 7B, 8A, 8B, 9A, and 9B are views sequentially showing a method of forming the display apparatus according to the embodiment of the present disclosure.

Figure 5A:
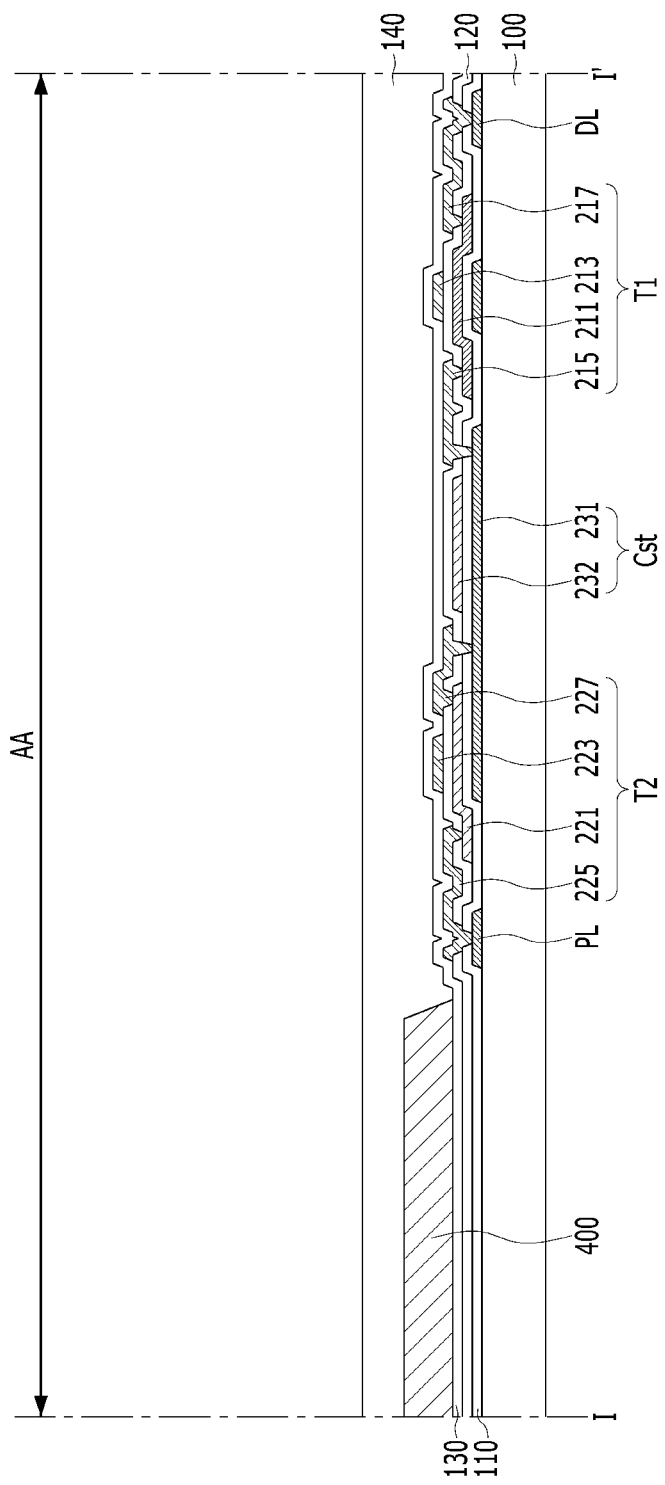

The method of forming the display apparatus according to the embodiment of the present disclosure will be described with reference to FIGS. 4A to 9A and 4B to 9B. First, the method of forming the display apparatus according to the embodiment of the present disclosure may include a step of providing a device substrate 100 including a display area AA in which a pixel area is disposed, and a bezel area NA disposed outside the display area AA, a step of forming a light-blocking pattern 231, a data line DL and a power voltage supply line PL on the display area AA of the device substrate 100, a step of forming a heating signal wiring SL on the bezel area NA of the device substrate 100, a step of forming a device buffer layer 110 on the device substrate 100 in which the light-blocking pattern 231, the data line DL, the power voltage supply line PL and the heating signal wiring SL are formed, a step of forming semiconductor patterns 211 and 221 on the device buffer layer 110 of the display area AA, a step of forming a gate insulating layer 120 on the device substrate 100 in which the semiconductor patterns 211 and 221 are formed, a step of forming gate electrodes 213 and 223, source electrodes 215 and 225, drain electrodes 217 and 227 and a capacitor electrode 232 on the gate insulating layer 120 of the display area AA, a step of forming a lower passivation layer 130 on the device substrate 100 in which the gate electrodes 213 and 223, the source electrodes 215 and 225, the drain electrodes 217 and 227 and the capacitor electrode 232 are formed, and a step of forming an over-coat layer 140 on the lower passivation layer 130, as shown in FIGS. 5A and 5B.

The light-blocking pattern 231 may be formed of a material having a high reflectance. The heating signal wiring SL may be formed of a conductive material. The heating signal wiring SL may be formed simultaneously with the light-blocking pattern 231. For example, the step of forming the light-blocking pattern 231 and the heating signal wiring SL may include a step of forming a metal layer having high reflectance on the device substrate 100, and a step of patterning the metal layer. The heating signal wiring SL may include the same material as the light-blocking pattern 231.

The gate electrodes 213 and 223, the source electrodes 215 and 225, the drain electrodes 217 and 227 and the capacitor electrode 232 may include a conductive material. The gate electrodes 213 and 223, the source electrodes 215 and 225, the drain electrodes 217 and 227 and the capacitor electrode 232 may be simultaneously formed. For example, a step of forming the gate electrodes 213 and 223, the source electrodes 215 and 225, the drain electrodes 217 and 227 and the capacitor electrode 232 may include a step of forming a metal layer having high reflectance on the gate insulating layer 120, and a step of pattering the metal layer. The gate electrodes 213 and 223, the source electrodes 215 and 225, the drain electrodes 217 and 227 and the capacitor electrode 232 may include the same material.

The semiconductor patterns 211 and 221, the gate electrodes 213 and 223, the source electrodes 215 and 225, and the drain electrodes 217 and 227 may constitute thin film transistors T1 and T2. The light-blocking pattern 231 may function as a capacitor electrode. For example, a storage capacitor Cst may be constituted by the light-blocking pattern 231 and the capacitor electrode 232.

Figure 6A:
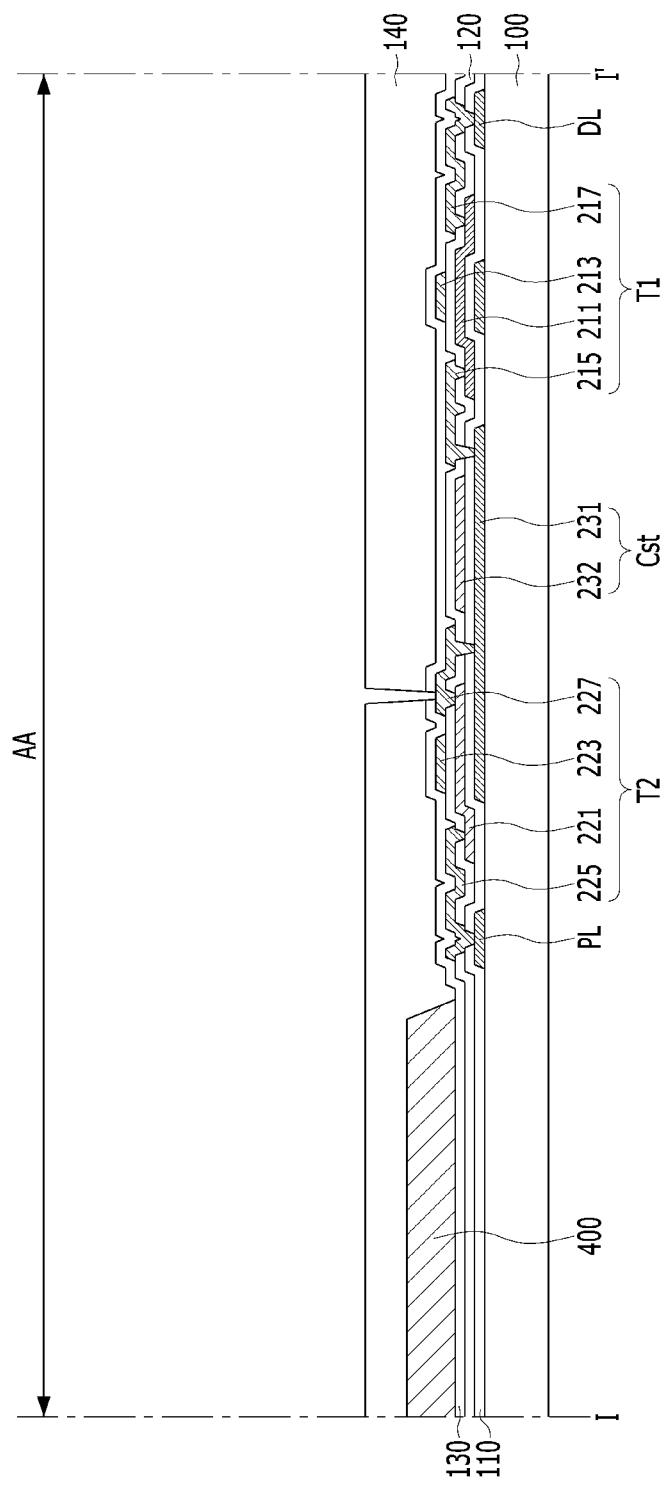
Figure 6B:
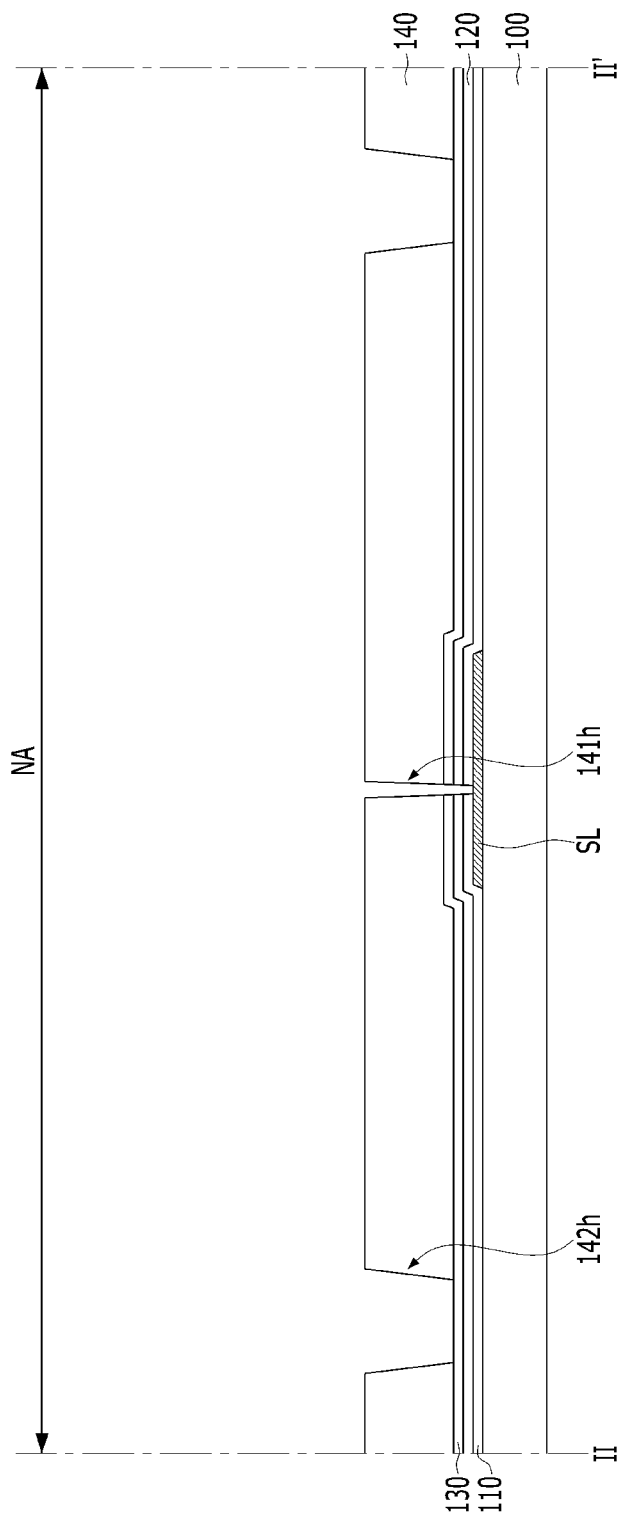

The method of forming the display apparatus according to the embodiment of the present disclosure may include a step of forming electrode contact holes, a heating contact hole 141h and at least one moisture-blocking trench 142h in the over-coat layer 140, as shown in FIGS. 6A and 6B.

The electrode contact holes may be formed in the pixel area of the display area AA. For example, each of the electrode contact holes may partially expose the drain electrode 217 and 227 of one of the thin film transistors T1 and T2. The heating contact hole 141h and the moisture-blocking trench 142h may be formed in the over-coat layer 140 of the bezel area NA. The heating contact hole 141h may overlap the heating signal wiring SL. For example, the heating contact hole 141h may partially expose the heating signal wiring SL. The moisture-blocking trench 142h may be formed around the heating contact hole 141h. For example, the moisture-blocking trench 142h may be formed between the heating signal wiring SL and the display area AA. The moisture-blocking trench 142h may completely penetrate the over-coat layer 140. For example, the moisture-blocking trench 142h may partially expose the lower passivation layer 130 of the bezel area NA.

Figure 7A:
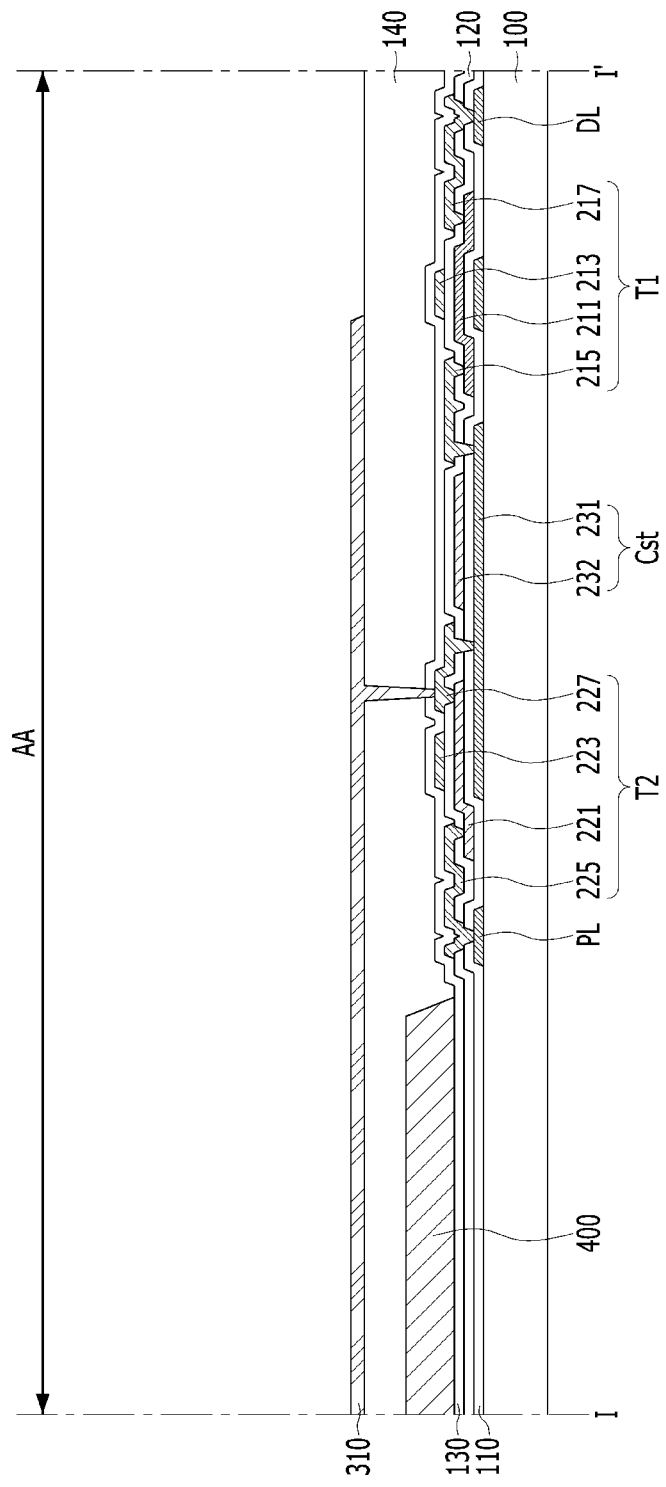
Figure 7B:
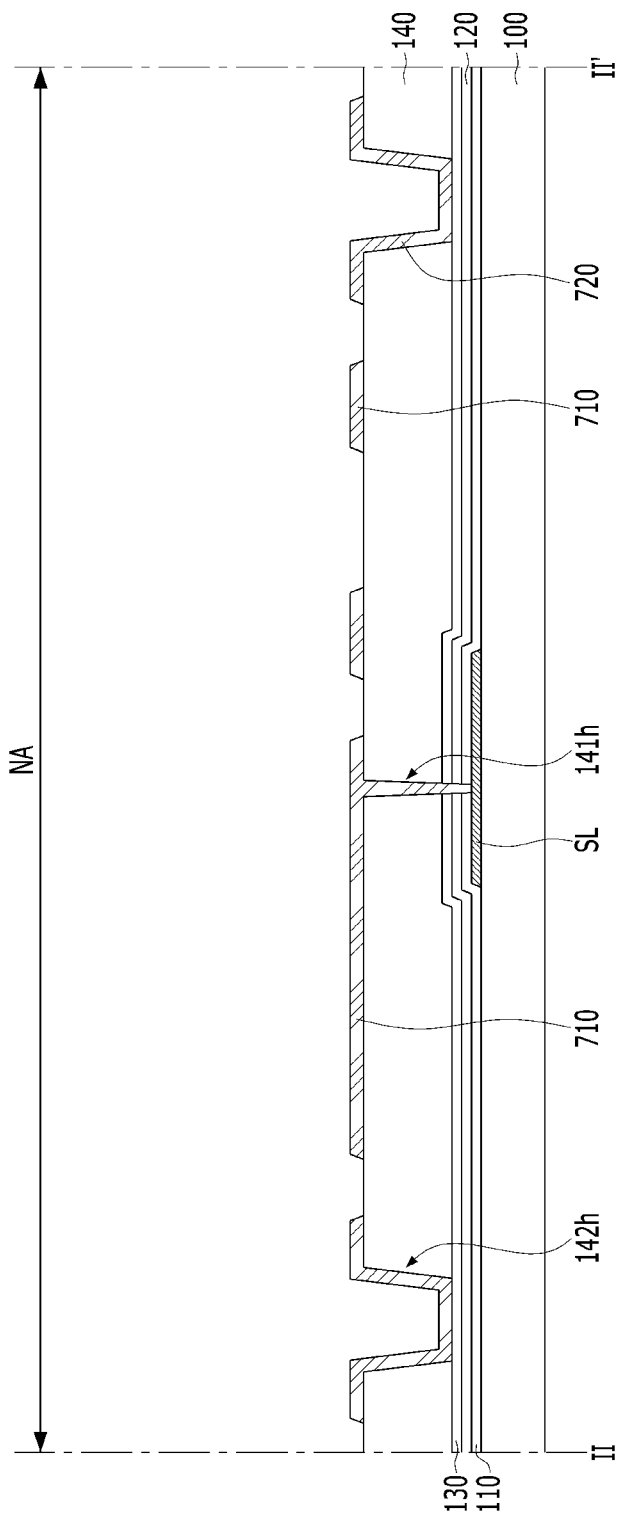

The method of forming the display apparatus according to the embodiment of the present disclosure may include a step of forming a first electrode 310, a heating pattern 710 and a barrier pattern 720 on the over-coat layer 140 in which the electrode contact hole, the heating contact hole 141h and the moisture-blocking trench 142h are formed, as shown in FIGS. 7A and 7B.

The first electrode 310 may be electrically connected to one of the thin film transistors T1 and T2 through the electrode contact hole. The heating pattern 710 may be electrically connected to the heating signal wiring SL through the heating contact hole 141h. The barrier pattern 720 may be formed in the moisture-blocking trench 142h. For example, the barrier pattern 720 may completely cover a surface of the moisture-blocking trench 142h. An end of the barrier pattern 720 may be disposed on the over-coat layer 140 of the bezel area NA.

The first electrode 310, the heating pattern 710 and the barrier pattern 720 may be simultaneously formed. For example, the step of forming the first electrode 310, the heating pattern 710 and the barrier pattern 720 may include a step of forming a conductive material layer on the over-coat layer 140 in which the electrode contact hole, the heating contact hole 141h and the moisture-blocking trench 142h are formed, and a step of patterning the conductive material layer.

Figure 8A:
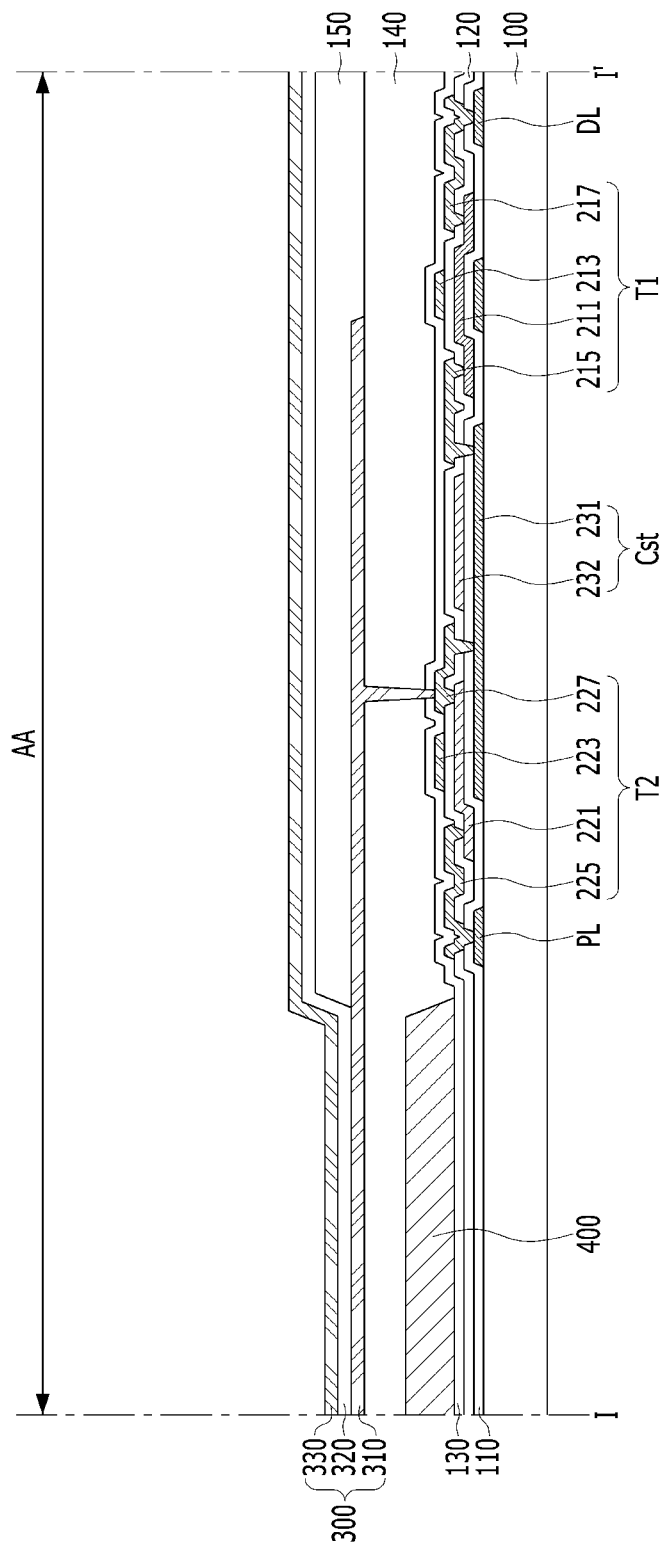
Figure 8B:
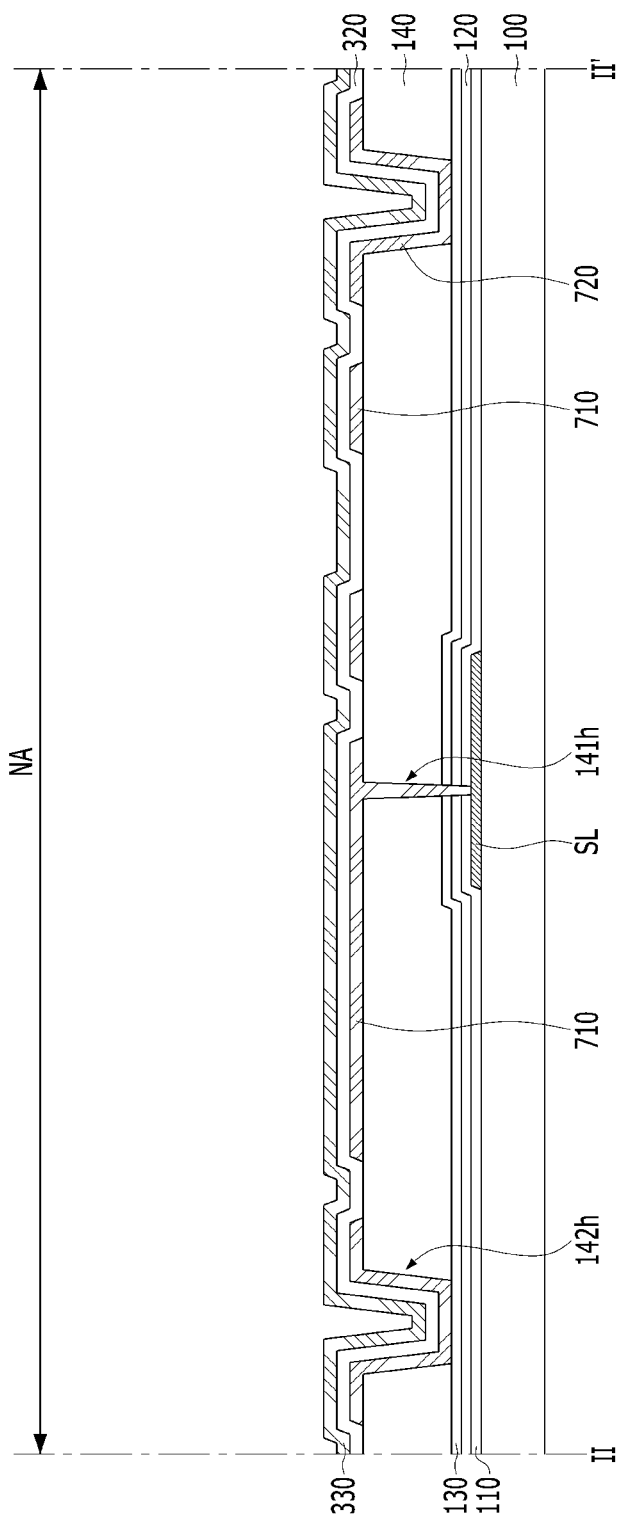

The method of forming the display apparatus according to the embodiment of the present disclosure may include a step of forming a bank insulating layer 150 covering an edge of the first electrode 310 on the over-coat layer 140, and a step of sequentially forming a light-emitting layer 320 and the second electrode 330 on the device substrate 100 in which the bank insulating layer 150 is formed, as shown in FIGS. 8A and 8B.

The light-emitting layer 320 and the second electrode 330 stacked on a portion of the first electrode 310 exposed by the bank insulating layer 150 may constitute a light-emitting device 300. The light-emitting layer 320 and the second electrode 330 may be formed on the display area AA and the bezel area NA of the device substrate 100. For example, the heating pattern 710 and the barrier pattern 720 may be covered by the light-emitting layer 320 and the second electrode 330.

Figure 9A:
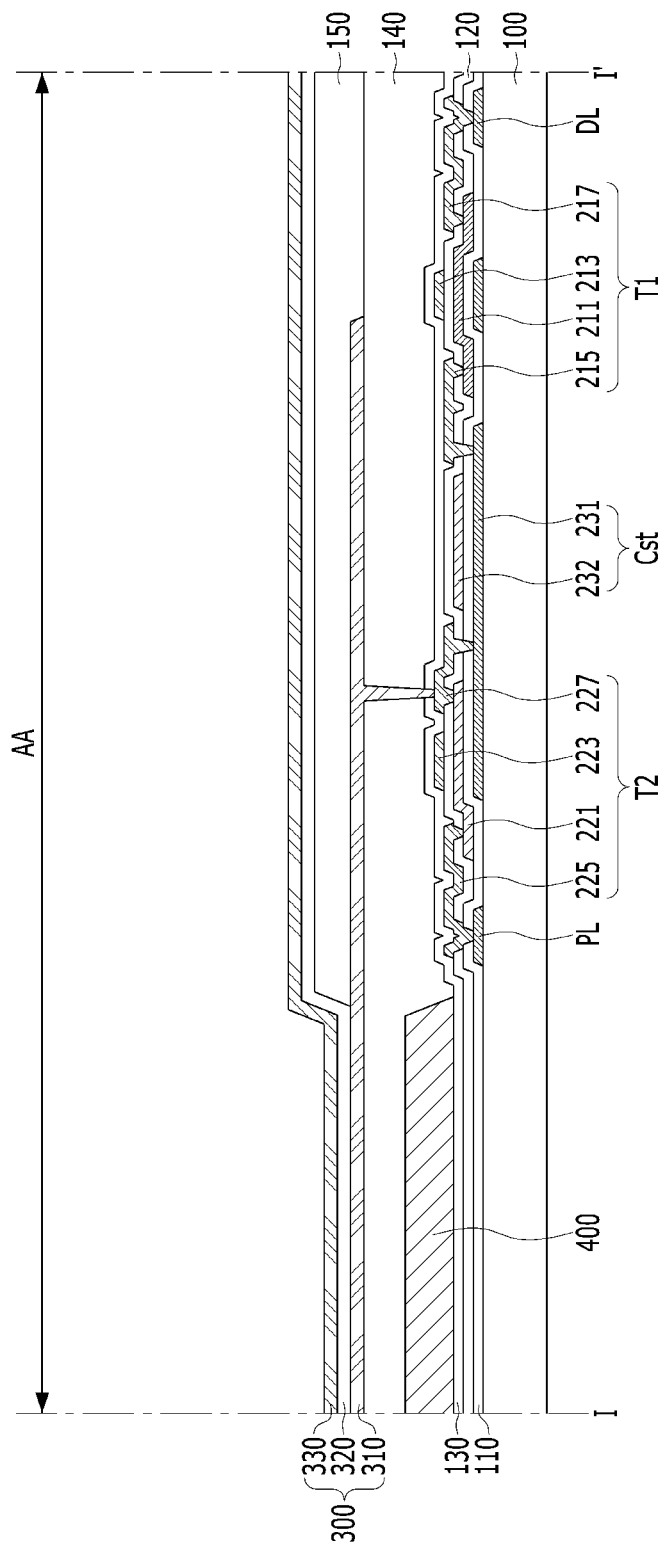
Figure 9B:
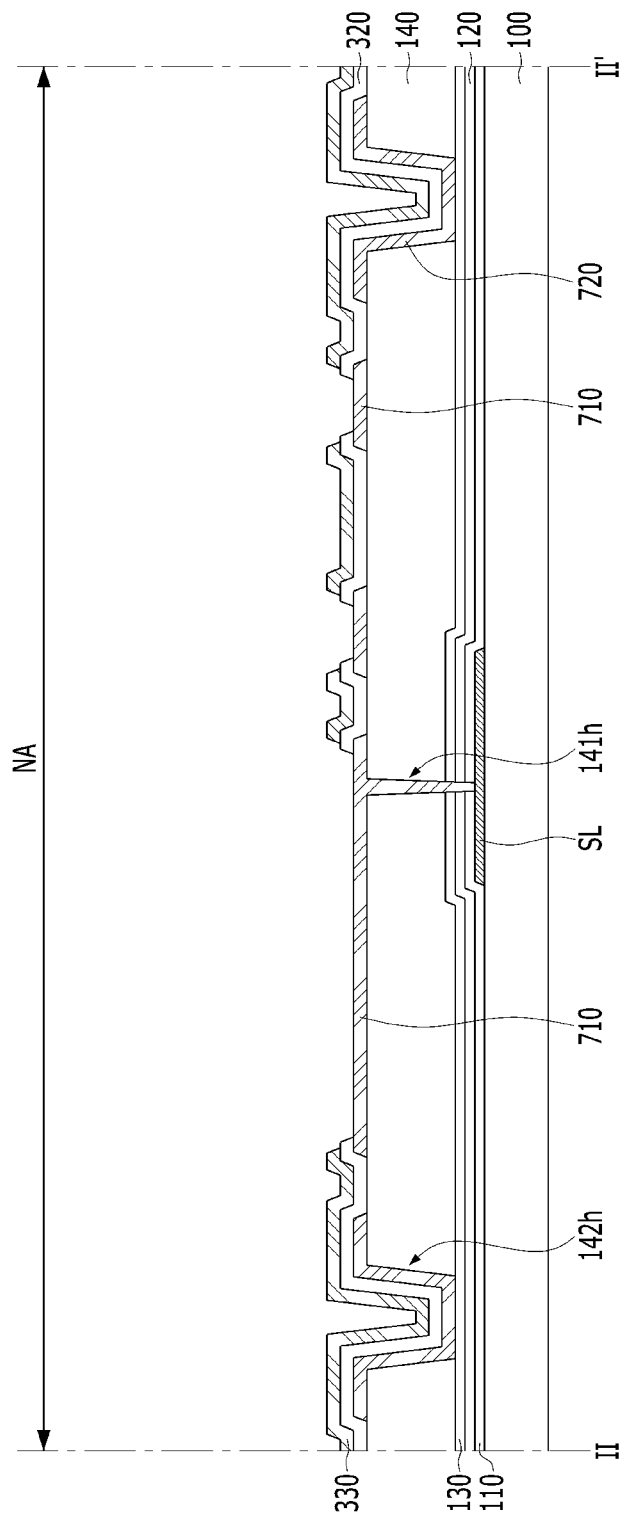

The method of forming the display apparatus according to the embodiment of the present disclosure may include a step of removing the light-emitting layer 320 and the second electrode 330, which are stacked on the heating pattern 710, as shown in FIGS. 9A and 9B.

The step of removing the light-emitting layer 320 and the second electrode 330, which are stacked on the heating pattern 710 may use a joule heating process. For example, the step of removing the light-emitting layer 320 and the second electrode 330, which are stacked on the heating pattern 710 may include a step of applying a high current through the heating signal wiring SL. That is, in the method of forming the display apparatus according to the embodiment of the present disclosure, the light-emitting layer 320 and the second electrode 330, which are stacked on the heating pattern 710 may be removed by the high current applied to the heating pattern 710 through the heating signal wiring SL. Thus, in the method of forming the display apparatus according to the embodiment of the present disclosure, a tail portion of the light-emitting layer 320 may be removed, without increasing the bezel area NA. Therefore, in the method of forming the display apparatus according to the embodiment of the present disclosure, deterioration of the light-emitting layer 320 due to the external moisture may be prevented, without decreasing the display area AA.

The method of forming the display apparatus according to the embodiment of the present disclosure may include a step of attaching an encapsulation substrate 600 on the device substrate 100 in which the light-emitting device 300 is formed using an entire surface adhesive layer 500, as shown in FIGS. 4A and 4B.

The entire surface adhesive layer 500 and the encapsulation substrate 600 may overlap the display area AA and the bezel area NA of the device substrate 100. For example, the entire surface adhesive layer 500 of the bezel area NA may be in direct contact with a surface of the heating pattern 710 opposite to the device substrate 100.

Accordingly, in the display apparatus according to the embodiment of the present disclosure, the heating signal wiring SL may be formed between the bezel area NA of the device substrate 100 and the over-coat layer 140, the heating patterns 710 electrically connected to the heating signal wiring SL may be formed on the over-coat layer 140, and the light-emitting layer 320 and the second electrode 330, which are stacked on the heating patterns 710 may be removed by the joule heating process. Thus, in the display apparatus according to the embodiment of the present disclosure, the penetration of the external moisture through the tail portion of the light-emitting layer 320 may be blocked, without increasing the bezel area NA.

And, in the display apparatus according to the embodiment of the present disclosure, the moisture-blocking trench 142h extending parallel to the heating signal wiring SL may be formed, and the side of the moisture-blocking trench 142h may be covered by the barrier pattern 720. Thus, in the display apparatus according to the embodiment of the present disclosure, the penetration of the external moisture through the over-coat layer 140 may be prevented by the moisture-blocking trench 142h penetrating the over-coat layer 140 of the bezel area NA and the barrier pattern 720. Therefore, in the display apparatus according to the embodiment of the present disclosure, the deterioration of the light-emitting layer 320 due to the external moisture may be effectively prevented.

Figure 10:
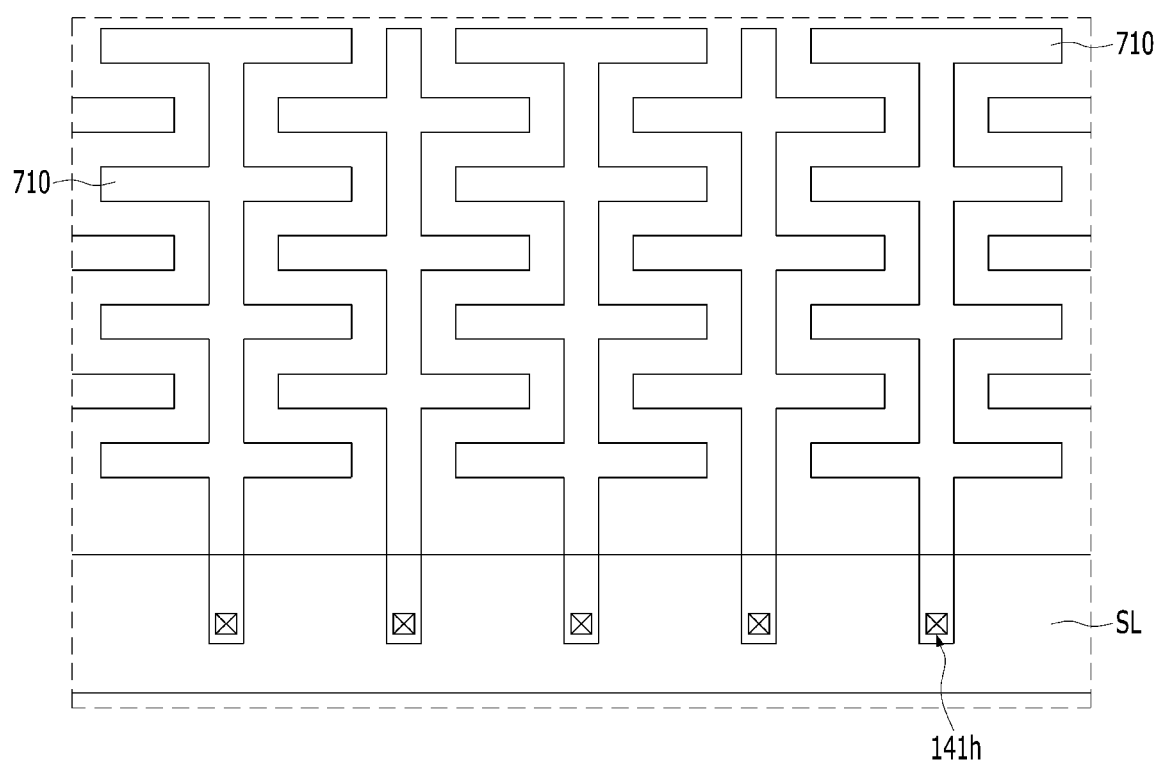
FIGS. 10 to 12 are views respectively showing the display apparatus according to another embodiment of the present disclosure.

The display apparatus according to the embodiment of the present disclosure is described that each of the heating patterns 710 has a symmetrical shape with respect to the heating signal wiring 720. However, in the display apparatus according to another embodiment of the present disclosure, the heating patterns 710 may have various shapes. For example, in the display apparatus according to another embodiment of the present disclosure, each of the heating patterns 710 may have a shape extending in a direction from the heating signal wiring SL, as shown in FIG. 10. Therefore, in the display apparatus according to another embodiment of the present disclosure, the degree of freedom for the shape of the heating patterns 710 may be improved.

Figure 11:
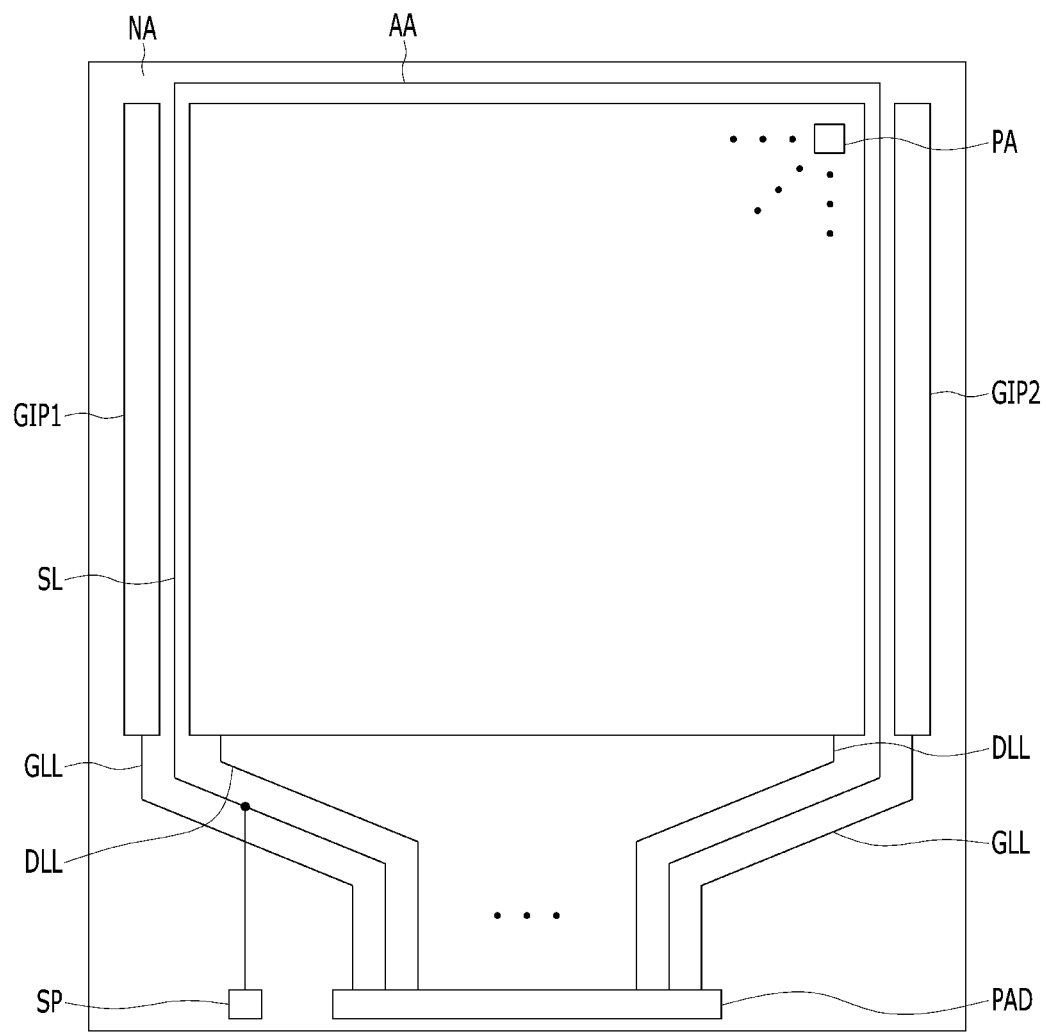

The display apparatus according to the embodiment of the present disclosure is described that the heating signal wiring SL is connected to the pad portion PAD. However, in the display apparatus according to another embodiment of the present disclosure, a heating pad SP electrically connected to the heating signal wiring SL may be disposed on the bezel area NA of the device substrate 100, as shown in FIG. 11. In one embodiment, the heating pad SP supplies the high current to the heating signal wiring SL. For example, the heating pad SP may be disposed side by side with the pad portion PAD. Thus, in the display apparatus according to another embodiment of the present disclosure, the high current applied through the heating signal wiring may not affect the peripheral wiring. And, in the display apparatus according to another embodiment of the present disclosure, the heating signal wiring SL may be disconnected from the heating pad SP, after removing the light-emitting layer 320 and the second electrode 330, which are stacked on the heating patterns 710. Therefore, in the display apparatus according to another embodiment of the present disclosure, defects due to unnecessary electrical connections may be effectively prevented.

Figure 12:
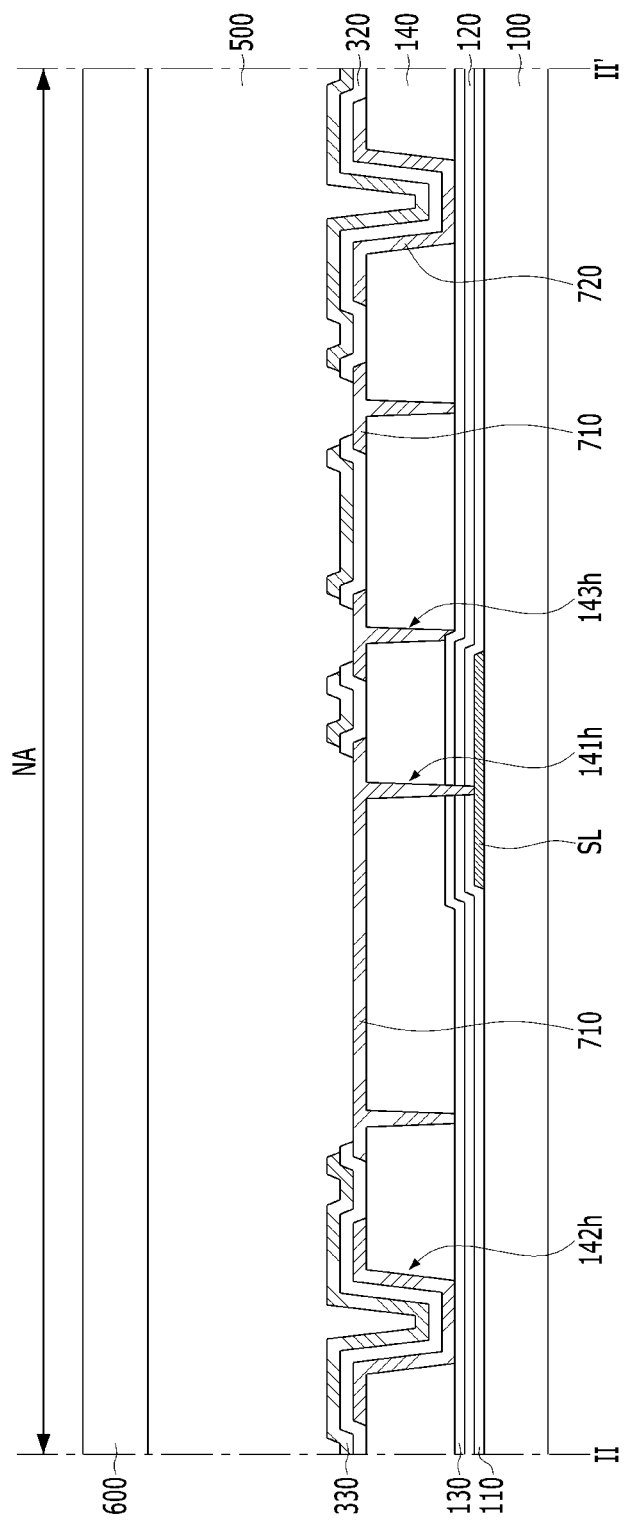

The display apparatus according to another embodiment of the present disclosure may include a moisture-blocking hole 143h penetrating the overcoat layer 140 between the heating contact hole 141h and the moisture-blocking trench 142h, as shown in FIG. 12. For example, the moisture-blocking hole 143h may be filled by one of the heating patterns 710. One of the heating patterns 710 may extend inside of the moisture-blocking hole 143h. The moisture-blocking hole 143h may be spaced away from the heating signal wiring SL. Thus, in the display apparatus according to another embodiment of the present disclosure, the moisture penetrating through the over-coat layer 140 of the bezel area NA may be significantly reduced. Therefore, in the display device according to another embodiment of the present invention, the deterioration of the light-emitting layer 320 due to the external moisture may be effectively prevented.

In the result, the display apparatus according to the embodiments of the present disclosure may comprise the light-emitting device disposed on the overcoat layer of the display area, the heating pattern disposed on the over-coat layer of the bezel area, the heating signal wiring covered by the overcoat layer of the bezel area, the entire surface adhesive layer disposed on the light-emitting device and the heating pattern, and the encapsulation substrate disposed on the entire surface adhesive layer, wherein the heating pattern may be electrically connected to the heating signal wiring, and wherein the entire surface adhesive layer may be in direct contact with the heating pattern. Thus, in the display apparatus according to the embodiments of the present disclosure, the penetration of the external moisture through the overcoat layer and the light-emitting layer may be prevented, without increasing the bezel area. Thereby, in the display apparatus according to the embodiments of the present disclosure, the damage of the light-emitting device due to the external moisture may be prevented.

What is claimed is:

1. A display apparatus comprising:
   a device substrate including a display area and a bezel area that at least partially surrounds the display area;
   an overcoat layer on the display area and the bezel area of the device substrate;
   a light-emitting device on a portion of the overcoat layer that is on the display area, the light-emitting device configured to emit light;
   a heating signal wiring between the device substrate and the portion of the overcoat layer on the bezel area;
   a plurality of heating patterns on the portion of the overcoat layer that is on the bezel area, the plurality of heating patterns electrically connected to the heating signal wiring;
   an adhesive layer on the light-emitting device in the display area and on the plurality of heating patterns in the bezel area, the adhesive layer in contact with the plurality of heating patterns; and
   an encapsulation substrate on the adhesive layer, the encapsulation substrate on the display area and the bezel area of the device substrate.

2. The display apparatus according to claim 1, wherein the heating signal wiring extends along an edge of the display area, and the plurality of heating patterns are disposed side by side along the heating signal wiring.

3. The display apparatus according to claim 1, wherein each of the plurality of heating patterns includes a portion that extends outside of the heating signal wiring such that the portion is non-overlapping with the heating signal wiring.

4. The display apparatus according to claim 3, wherein each of the plurality of heating patterns includes a region that extends in a same direction as the heating signal wiring.

5. The display apparatus according to claim 3, wherein each of the plurality of heating patterns has a shape that is symmetrical with respect to the heating signal wiring.

6. The display apparatus according to claim 1, wherein the light-emitting device includes a first electrode, a light-emitting layer on the first electrode, and a second electrode on the light-emitting layer, and
   wherein the plurality of heating patterns include a material that is a same as a material of the first electrode of the light-emitting device.

7. The display apparatus according to claim 1, further comprising:
   at least one moisture-blocking trench penetrating through a thickness of the portion of the overcoat layer in the bezel area, the at least one moisture-blocking trench extending in parallel along a length of the heating signal wiring; and
   a barrier pattern in the moisture-blocking trench, the barrier pattern covering a side of the moisture-blocking trench.

8. The display apparatus according to claim 7, wherein the barrier pattern includes a same material as the plurality of heating patterns.

9. The display apparatus according to claim 7, further comprising:
 a lower passivation layer between the device substrate and the portion of the overcoat layer in the bezel area, the lower passivation layer on the heating signal wiring.

10. The display apparatus according to claim 7, further comprising:
 a moisture-blocking hole between the heating signal wiring and the moisture-blocking trench, the moisture-blocking hole penetrating through the thickness of the overcoat layer,
 wherein a portion one of the plurality of heating patterns is inside of the moisture-blocking hole.

11. The display apparatus according to claim 1, further comprising:
 a pixel driving circuit on the display area of the device substrate, the pixel driving circuit electrically connected to the light-emitting device;
 at least one signal wiring electrically connecting the pixel driving circuit and a pad portion that is on the bezel area of the device substrate; and
 a heating pad on the bezel area of the device substrate, the heating pad electrically connected to the heating signal wiring to supply a current to the heating signal wiring.

12. A display apparatus comprising:
 a substrate including a display area and a bezel area that at least partially surrounds the display area;
 a light-emitting device in the display area, the light-emitting device including a first electrode in the display area, a light-emitting layer including a first portion on the first electrode in the display area and a second portion that extends from the first portion of the light-emitting layer to the bezel area, and a second electrode including a first portion on the first portion of the light-emitting layer in the display area and a second portion that extends from the first portion of the second electrode to the bezel area;
 a heating signal wiring on the bezel area of the substrate and partially surrounds the display area, the heating signal wiring configured to apply a current,
 wherein the second portion of the light-emitting layer in the bezel area and the second portion of the second electrode in the bezel area are non-overlapping with the heating signal wiring.

13. The display apparatus of claim 12, further comprising:
 a plurality of heating patterns in the bezel area, the plurality of heating patterns electrically connected to the heating signal wiring.

14. The display apparatus of claim 13, further comprising:
 an overcoat layer including a portion in the display area and a portion in the bezel area, the portion of the overcoat layer in the bezel area between the heating signal wiring and the plurality of heating patterns.

15. The display apparatus of claim 14, further comprising:
 a trench through a thickness of the overcoat layer; and
 a barrier pattern in the trench, the barrier pattern including a same material as the plurality of heating patterns.

16. The display apparatus of claim 15, wherein the second portion of the light-emitting layer in the bezel area and the second portion of the second electrode in the bezel area are on the barrier pattern in the trench.

17. The display apparatus of claim 16, wherein a part of the barrier pattern, a part of the second portion of the light-emitting layer, and a part of the second portion of the second electrode extend out of the trench onto the overcoat layer towards the heating signal wiring.

18. The display apparatus of claim 15, further comprising:
 a hole that penetrates through the thickness of the overcoat layer, the hole between the trench and the heating signal wiring,
 wherein a portion of one of the plurality of heating patterns is in the hole.

19. The display apparatus of claim 13, wherein the plurality of heating patterns includes a first heating pattern having a first shape and a second heating pattern having a second shape that is different from the first shape.

20. A method of forming a display apparatus comprising:
 forming a substrate including a display area and a bezel area that at least partially surrounds the display area;
 forming a heating signal wiring on the bezel area of the substrate that partially surrounds the display area;
 forming an overcoat layer including a portion that is on the display area and a portion that is on the heating signal wiring in the bezel area;
 forming a first electrode on the portion of the overcoat layer in the display area and a plurality of heating patterns on the portion of the overcoat layer in the bezel area, the plurality of heating patterns electrically connected to the heating signal wiring;
 forming a light-emitting layer including a first portion that is on the first electrode in the display area and a second portion that extends from the first portion of the light-emitting layer to the bezel area such that a part of the second portion of the light-emitting layer is on the plurality of heating patterns;
 forming a second electrode including a first portion that is on the first portion of the light-emitting layer in the display area and a second portion that extends from the first portion of the second electrode to the bezel area such that a part of the second portion of the second electrode is on the part of the second portion of the light-emitting layer that is on the plurality of heating patterns; and
 removing the part of the second portion of the light-emitting layer and the part of the second portion of the second electrode by applying a current to the heating signal wiring that supplies the current to the plurality of heating patterns.

* * * * *